United States Patent
Hu et al.

(10) Patent No.: US 11,812,648 B2
(45) Date of Patent: Nov. 7, 2023

(54) PIXEL ARRAY AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventors: Ming Hu, Beijing (CN); Yan Huang, Beijing (CN); Chang Luo, Beijing (CN); Jianpeng Wu, Beijing (CN); Benlian Wang, Beijing (CN); Peng Xu, Beijing (CN); Wei Zhang, Beijing (CN); Qian Xu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/850,172

(22) Filed: Jun. 27, 2022

(65) Prior Publication Data
US 2022/0328573 A1 Oct. 13, 2022

Related U.S. Application Data

(63) Continuation of application No. 17/439,861, filed as application No. PCT/CN2020/118991 on Sep. 29, 2020.

(30) Foreign Application Priority Data

Sep. 10, 2020 (WO) ................ PCT/CN2020/114619

(51) Int. Cl.
*H01L 27/32* (2006.01)
*H10K 59/35* (2023.01)

(52) U.S. Cl.
CPC ......... *H10K 59/353* (2023.02); *H10K 59/351* (2023.02); *H10K 59/352* (2023.02)

(58) Field of Classification Search
CPC ............. H01L 27/3216; H01L 27/3218; H01L 27/3211; H10K 59/352; H10K 59/353
See application file for complete search history.

(56) References Cited

U.S. PATENT DOCUMENTS 10,446,618 B2 * 10/2019 Wang ...................... H01L 27/12
10,720,481 B2 * 7/2020 Xiao ................... H01L 27/3246
(Continued)

FOREIGN PATENT DOCUMENTS

| CN | 104282727 A | 1/2015 |
| CN | 204885167 U | 12/2015 |

(Continued)

OTHER PUBLICATIONS

Machine translation, Murai, Japanese Pat. Pub. No. JP2005-352140A, translation date: Dec. 24, 2022, Espacenet, all pages. (Year: 2022).*

(Continued)

*Primary Examiner* — Victoria K. Hall
(74) *Attorney, Agent, or Firm* — HOUTTEMAN LAW LLC

(57) ABSTRACT

There is provided a pixel array including a plurality of sub-pixels, which include first sub-pixels, second sub-pixels, and third sub-pixels. The first and third sub-pixels are alternately arranged along a row direction and form a plurality of first pixel rows, the first and third sub-pixels, which are in a same column, in the plurality of first pixel rows are alternately arranged, and the second sub-pixels are arranged along the row direction and form second pixel rows. Lines sequentially connecting centers of any two of the first sub-pixels and any two of the third sub-pixels, (Continued)

which are arranged in an array, together form a first virtual quadrilateral, and one of the second sub-pixels is in each first virtual quadrilateral. At least one interior angle of the first virtual quadrilateral is not 90°. At least one of the first, second and third sub-pixels has a corner circularly or rectilinearly chamfered.

16 Claims, 20 Drawing Sheets

(56) References Cited

U.S. PATENT DOCUMENTS

| | | | | |
|---|---|---|---|---|
| 2005/0248262 | A1* | 11/2005 | Brown Elliott | G09G 3/3614 313/500 |
| 2013/0113363 | A1* | 5/2013 | Hong | H01L 27/3216 313/498 |
| 2014/0319479 | A1* | 10/2014 | Park | H01L 51/525 257/40 |
| 2015/0123952 | A1* | 5/2015 | Kim | G09G 3/3225 345/82 |
| 2015/0379924 | A1* | 12/2015 | Matsueda | G09G 3/3208 345/77 |
| 2016/0253943 | A1* | 9/2016 | Wang | G09G 3/3208 345/694 |
| 2017/0194398 | A1* | 7/2017 | Kim | H10K 59/352 |
| 2017/0317150 | A1* | 11/2017 | Chung | H01L 27/3218 |
| 2018/0088260 | A1* | 3/2018 | Jin | H01L 27/3218 |
| 2018/0254304 | A1* | 9/2018 | Hong | H01L 27/3279 |
| 2018/0261654 | A1 | 9/2018 | Hwang et al. | |
| 2019/0140030 | A1* | 5/2019 | Huangfu | G09G 3/3225 |
| 2019/0252469 | A1* | 8/2019 | Xiao | H01L 27/326 |
| 2019/0355794 | A1* | 11/2019 | Dai | C23C 14/12 |
| 2019/0393275 | A1* | 12/2019 | Kim | H01L 27/326 |
| 2020/0127060 | A1* | 4/2020 | Li | H01L 27/3216 |
| 2020/0168692 | A1* | 5/2020 | Liu | H01L 27/3276 |
| 2020/0273924 | A1 | 8/2020 | Xiao et al. | |
| 2020/0343318 | A1* | 10/2020 | Li | H01L 27/3218 |
| 2020/0357862 | A1* | 11/2020 | Wang | C23C 14/24 |
| 2020/0402442 | A1* | 12/2020 | Liu | G09G 3/2003 |
| 2021/0091145 | A1* | 3/2021 | Huangfu | H01L 27/3218 |
| 2021/0098539 | A1* | 4/2021 | Zhang | H01L 27/3216 |
| 2021/0098540 | A1* | 4/2021 | Chen | H01L 27/326 |
| 2021/0193766 | A1* | 6/2021 | Liu | H01L 27/3218 |
| 2021/0335909 | A1* | 10/2021 | Wang | H01L 27/3218 |
| 2021/0343800 | A1* | 11/2021 | Zhao | H01L 51/0097 |
| 2021/0343801 | A1* | 11/2021 | Wang | H01L 51/0011 |
| 2022/0208890 | A1 | 6/2022 | Liu et al. | |
| 2022/0208891 | A1* | 6/2022 | Liu | H01L 27/3218 |
| 2022/0310710 | A1 | 9/2022 | Hu et al. | |
| 2022/0310711 | A1* | 9/2022 | Liu | H10K 59/122 |
| 2022/0328573 | A1 | 10/2022 | Hu et al. | |
| 2022/0352259 | A1* | 11/2022 | Xue | H10K 59/353 |
| 2023/0006004 | A1* | 1/2023 | Li | H10K 59/121 |
| 2023/0081009 | A1* | 3/2023 | Shi | G09G 3/3216 |
| 2023/0087603 | A1* | 3/2023 | Wang | H10K 59/353 |

FOREIGN PATENT DOCUMENTS

| | | | | |
|---|---|---|---|---|
| CN | 204885167 | U * | 12/2015 | H01L 27/12 |
| CN | 205355055 | U | 6/2016 | |
| CN | 106486514 | A | 3/2017 | |
| CN | 107887404 | A * | 4/2018 | H01L 27/3218 |
| CN | 107887404 | A | 4/2018 | |
| CN | 207966983 | u | 10/2018 | |
| CN | 207966983 | U * | 10/2018 | H01L 27/32 |
| CN | 207966985 | U * | 10/2018 | C23C 14/04 |
| CN | 207966985 | U | 10/2018 | |
| CN | 207966988 | U * | 10/2018 | C23C 14/04 |
| CN | 207966995 | U * | 10/2018 | C23C 14/04 |
| CN | 207966995 | U | 10/2018 | |
| CN | 108922919 | A | 11/2018 | |
| CN | 208077981 | U * | 11/2018 | C23C 14/04 |
| CN | 109300958 | A * | 2/2019 | H01L 27/3218 |
| CN | 109300958 | A | 2/2019 | |
| CN | 109860237 | A | 6/2019 | |
| CN | 109935617 | A | 6/2019 | |
| CN | 109935617 | A * | 6/2019 | C23C 14/04 |
| CN | 208970513 | U | 6/2019 | |
| CN | 208970513 | U * | 6/2019 | C23C 14/04 |
| CN | 109994503 | A | 7/2019 | |
| CN | 110137206 | A | 8/2019 | |
| CN | 110620135 | A | 12/2019 | |
| CN | 111341815 | A | 6/2020 | |
| CN | 111341817 | A | 6/2020 | |
| CN | 111682056 | A * | 9/2020 | H01L 27/3216 |
| CN | 111725289 | A * | 9/2020 | H01L 27/3216 |
| CN | 112436029 | A | 3/2021 | |
| CN | 112436029 | A * | 3/2021 | H01L 27/3216 |
| CN | 112436030 | A * | 3/2021 | H01L 27/3216 |
| CN | 112436030 | A | 3/2021 | |
| CN | 112864215 | A | 5/2021 | |
| CN | 111416048 | B * | 9/2022 | H10K 59/351 |
| JP | 2005-352140 | A * | 12/2005 | H01L 27/3213 |
| WO | WO2022052010 | A1 * | 3/2022 | H01L 27/32 |
| WO | WO2022052834 | A1 | 3/2022 | |

OTHER PUBLICATIONS

Machine translation, Wang, Chinese Pat. Pub. No. CN207966985U, translation date: Dec. 17, 2022, Espacenet, all pages. (Year: 2022).*
Machine translation, Li, Chinese Pat. Pub. No. CN111725289A, translation date: Dec. 24, 2022, Clarivate Analytics, all pages. (Year: 2022).*
Machine translation, Xiao, Chinese Pat. Pub. No. CN208077981U, translation date: Dec. 24, 2022, Clarivate Analytics, all pages. (Year: 2022).*
Machine translation, Wang, Chinese Pat. Pub. No. CN111682056A, translation date: Dec. 24, 2022, Clarivate Analytics, all pages. (Year: 2022).*
Machine translation, Xiao, Chinese Pat. Pub. No. CN207966988U, translation date: Dec. 24, 2022, Clarivate Analytics, all pages. (Year: 2022).*
Machine translation, Luo, WIPO Pat. Pub. No. WO2022052010A1, translation date: Dec. 24, 2022, Clarivate Analytics, all pages. (Year: 2022).*
Machine translation, Ji, Chinese Pat. Pub. No. CN109935617A, translation date: Dec. 17, 2022, Espacenet, all pages. (Year: 2022).*
Machine translation, Xu, Chinese Pat. Pub. No. CN208970513U, translation date: Dec. 17, 2022, Espacenet, all pages. (Year: 2022).*
Machine translation, Li, Chinese Pat. Pub. No. CN207966995U, translation date: Dec. 17, 2022, Espacenet, all pages. (Year: 2022).*
Machine translation, Wang, Chinese Pat. Pub. No. CN207966983U, translation date: Dec. 17, 2022, Espacenet, all pages. (Year: 2022).*
Machine translation, Zhang, Chinese Pat. Pub. No. CN107887404A, translation date: Dec. 17, 2022, Espacenet, all pages. (Year: 2022).*
Machine translation, Wang, Chinese Pat. Pub. No. CN204885167U, translation date: Dec. 17, 2022, Espacenet, all pages. (Year: 2022).*
Machine translation, Wang, Chinese Pat. Pub. No. CN109300958A, translation date: Dec. 17, 2022, Espacenet, all pages. (Year: 2022).*
Machine translation, Liu, Chinese Pat. Pub. No. CN112436030A, translation date: Dec. 17, 2022, Espacenet, all pages. (Year: 2022).*
Machine translation, Liu, Chinese Pat. Pub. No. CN112436029A, translation date: Dec. 17, 2022, Espacenet, all pages. (Year: 2022).*
Machine translation, Han, Chinese Pat. Pub. No. CN111416048B, translation date: Apr. 10, 2023, Clarivate Analytics, all pages. (Year: 2023).*
WIPO, ISR of PCT-CN2021-125469 dated Jun. 16, 2021.
WIPO, ISR of PCT-CN2021-070308 dated Jun. 16, 2021.
WIPO, ISR of PCT-CN2021-096385 dated Aug. 27, 2021.
WIPO, ISR of PCT-CN2021-115548 dated Nov. 8, 2021.
China Patent Office, First Office Action dated Jun. 1, 2021, for corresponding Chinese application No. 202080002174.5
WIPO, International Search Report regarding the PCT international application No. PCT/CN2020/118991 dated Jun. 10, 2021.
WIPO, International Search Report regarding the PCT international application No. PCT/CN2020/125469 dated Jun. 16, 2021.

(56) References Cited

OTHER PUBLICATIONS

IP Australia, Office Action, dated Dec. 12, 2022, AU application 2020450961.
IP Australia, Second Office Action dated Apr. 4, 2023, for corresponding AU application 2020450961.
China Patent Office, First Office Action dated Apr. 10, 2023, for corresponding CN application 202180000017.5.
Japan Patent Office, First Office Action dated Apr. 24, 2023, for corresponding JP application 2021-577081.

* cited by examiner

PIXEL ARRAY AND DISPLAY DEVICE

CROSS REFERENCE TO RELATED APPLICATIONS

This is a Continuation of U.S. patent application Ser. No. 17/439,861, filed Sep. 16, 2021, which is a National Phase Application filed under 35 U.S.C. 371 as a national stage of PCT/CN2020/118991 filed on Sep. 29, 2020, which is an application claiming the priority of PCT/CN2020/114619, filed on Sep. 10, 2020, the content of each of which is incorporated herein by reference in its entirety.

TECHNICAL FIELD

The present disclosure relates to the field of display technology, and in particular to a pixel array and a display device.

BACKGROUND

An organic light emitting diode (OLED) display device is one of the hot spots in the research field of current flat panel display devices, and has the advantages of low energy consumption, low production cost, self-luminescence, wide viewing angle, fast response speed, and the like as compared with a liquid crystal display device. At present, in a field of flat panel display such as a mobile phone, a tablet computer, a digital camera or the like, the OLED display device has begun to replace a traditional liquid crystal display (LCD).

A structure of the OLED display device mainly includes: a substrate and pixels arranged in a matrix on the substrate. In general, in each of the pixels, an organic light emitting device is formed at a position of a corresponding pixel on an array substrate, by using an organic material through a high-precision metal mask and an evaporation coating film forming technology.

SUMMARY

Some embodiments of the present disclosure provide a pixel array and a display device.

In a first aspect, embodiments of the present disclosure provide a pixel array, including a plurality of sub-pixels, which include first sub-pixels, second sub-pixels, and third sub-pixels; the first sub-pixels and the third sub-pixels are alternately arranged along a row direction and form a plurality of first pixel rows, the first sub-pixels and the third sub-pixels, which are in a same column, in the plurality of first pixel rows are alternately arranged, and the second sub-pixels are arranged side by side along the row direction and form a plurality of second pixel rows; lines sequentially connecting centers of two of the first sub-pixels and two of the third sub-pixels, which are arranged in an array, together form a first virtual quadrilateral, and one of the second sub-pixels is in each first virtual quadrilateral; wherein at least a portion of interior angles of the first virtual quadrilateral is not equal to 90°; and a straight line, which is in the row direction or a column direction and passes through a center of each sub-pixel of at least one sub-pixel of the plurality of sub-pixels, divides the sub-pixel into two parts respectively having different areas.

In an embodiment, a ratio of the areas of the two parts ranges from 2:8 to 8:2.

In an embodiment, the two parts include a first corner and a second corner opposite to each other, respectively, and a distance from a vertex of the first corner to a center of the sub-pixel including the two parts is different from a distance from a vertex of the second corner to the center of the sub-pixel including the two parts.

In an embodiment, the distance from the vertex of the first corner to the center of the sub-pixel including the two parts is less than the distance from the vertex of the second corner to the center of the sub-pixel including the two parts.

In an embodiment, a contour of a shape of each sub-pixel of the at least one sub-pixel includes an arc line portion, and the arc line portion has a length less than a length of each of remaining portions of the contour of the shape of the sub-pixel including the arc line portion.

In an embodiment, the length of the arc line portion is less than a size of the sub-pixel including the arc line portion in the row direction or a column direction.

In an embodiment, for each first virtual quadrilateral, distances from a center of the second sub-pixel within the first virtual quadrilateral to the centers of the two first sub-pixels on vertexes of the first virtual quadrilateral are not equal to each other, and a ratio of minimum distances between the second sub-pixel within the first virtual quadrilateral and the two first sub-pixels on the vertexes of the first virtual quadrilateral ranges from 0.8 to 1.2; and/or for each first virtual quadrilateral, distances from a center of the second sub-pixel within the first virtual quadrilateral to the centers of the two third sub-pixels on vertexes of the first virtual quadrilateral are not equal to each other, and a ratio of minimum distances between the second sub-pixel within the first virtual quadrilateral and the two third sub-pixels on the vertexes of the first virtual quadrilateral ranges from 0.8 to 1.2.

In an embodiment, for each first virtual quadrilateral, connecting lines between a center of the second sub-pixel within the first virtual quadrilateral to the centers of the two first sub-pixels on vertexes of the first virtual quadrilateral are not parallel to each other or not on a same straight line, and extension lines of minimum paths between the second sub-pixel within the first virtual quadrilateral and the two first sub-pixels on the vertexes of the first virtual quadrilateral are parallel to each other or on a same straight line; and/or for each first virtual quadrilateral, connecting lines between a center of the second sub-pixel within the first virtual quadrilateral to the centers of the two third sub-pixels on vertexes of the first virtual quadrilateral are not parallel to each other or not on a same straight line, and extension lines of minimum paths between the second sub-pixel within the first virtual quadrilateral and the two third sub-pixels on the vertexes of the first virtual quadrilateral are parallel to each other or on a same straight line.

In an embodiment, a contour of a shape of each sub-pixel of the at least one sub-pixel includes an arc line portion, and for the sub-pixel having the arc line portion, a connecting line between a midpoint of the arc line portion and a vertex of a vertex angle opposite to the arc line portion passes through a center of the sub-pixel.

In an embodiment, among the plurality of first pixel rows, adjacent two third sub-pixels on one first pixel row have chamfered corners, the chamfered corners of the adjacent two third sub-pixels are in the row direction and have opposite orientations, the two third sub-pixels respectively located on two first pixel rows, which are respectively on both sides of the one first pixel row and adjacent to the one first pixel row, have chamfered corners, and the chamfered corners of the two third sub-pixels respectively located on the two first pixel rows are in the column direction and have opposite orientations.

In an embodiment, a shape of each of the first sub-pixels, the second sub-pixels and the third sub-pixels includes a polygon, the third sub-pixels comprise the at least one sub-pixel, and a shape of each of the third sub-pixels is different from a shape of each of the first sub-pixels or a shape of each of the second sub-pixels.

In an embodiment, an intersection point of extension lines of both sides of at least one vertex angle of the first sub-pixels, the second sub-pixels and the third sub-pixels does not coincide with a vertex of the at least one vertex angle, and a distance from the intersection point of extension lines of both sides of at least one vertex angle to a center of the sub-pixel including the at least one vertex angle is not equal to a distance from an intersection point of extension lines of both sides of another vertex angle of the sub-pixel including the at least one vertex angle to the center of the sub-pixel including the at least one vertex angle.

In an embodiment, the shape of each of the first sub-pixels, the second sub-pixels and the third sub-pixels includes a polygon, and each of the first sub-pixels, the second sub-pixels and the third sub-pixels includes a pair of vertex angles opposite to each other in the row direction and a pair of vertex angles opposite to each other in a column direction; and in each first pixel row, vertexes of the vertex angles of the first sub-pixels and the third sub-pixels in the row direction are on a same straight line, and/or in each pixel column where the first sub-pixels and the third sub-pixels are located, vertexes of the vertex angles of the first sub-pixels and the third sub-pixels in a column direction are on a same straight line.

In an embodiment, the first sub-pixels include red sub-pixels, the second sub-pixels include green sub-pixels, the third sub-pixels include blue sub-pixels, and each of the third sub-pixels has an area which is larger than that of each of the first sub-pixels and larger than that of each of the second sub-pixels.

In an embodiment, a connecting line between an intersection point of extension lines of both sides of a first corner of each sub-pixel of the at least one sub-pixel and a center of the sub-pixel is a first line segment, and a straight line perpendicular to the first line segment and passing through a center of each sub-pixel of the at least one sub-pixel divides the sub-pixel into the two parts respectively having different areas.

In an embodiment, one of the two parts includes a first chamfered corner, and the first chamfered corner has a shape different from a shape of at least one corner, other than the first chamfered corner, of the sub-pixel including the two parts.

In an embodiment, the two parts include a first corner and a second corner, respectively, and the first corner and the second corner have different shapes, respectively.

In an embodiment, a contour of a shape of each of the at least one sub-pixel includes an arc line and two straight line segments directly connecting to the arc line, respectively.

In an embodiment, the two straight line segments directly connecting to the arc line have a same length.

In an embodiment, a connecting line between an intersection point of extension lines of both sides of a vertex angle of each sub-pixel of the at least one sub-pixel and a center of the sub-pixel is a symmetry axis of the sub-pixel.

DETAILED DESCRIPTION

Figure 1:
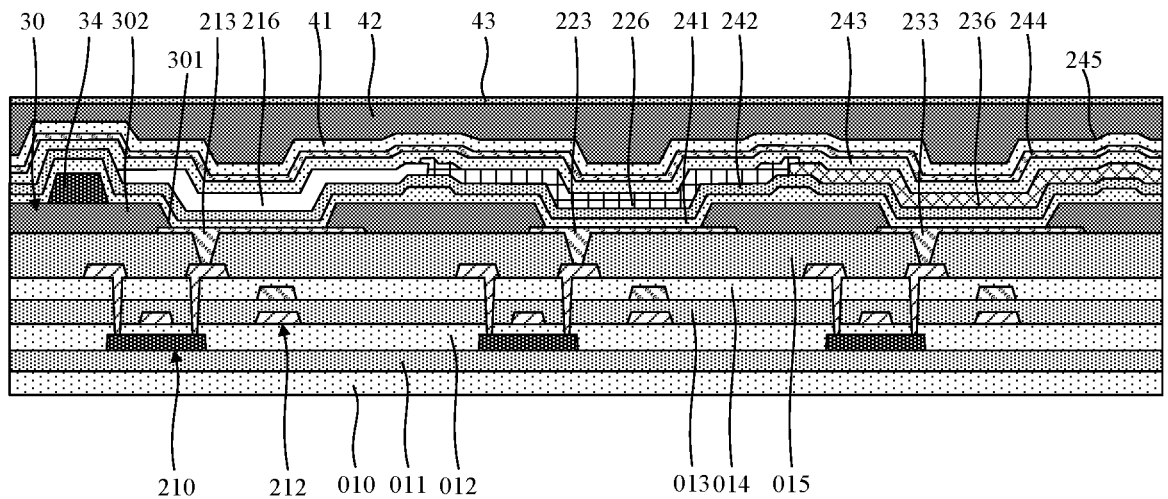
FIG. 1 is a schematic diagram showing a structure of film layers of an exemplary pixel array.

To enable one of ordinary skill in the art to better understand technical solutions of the present disclosure, the present disclosure will be further described in detail below with reference to the accompanying drawings and exemplary embodiments.

Unless defined otherwise, technical or scientific terms used herein shall have the general meaning as understood by one of ordinary skill in the art to which the present disclosure belongs. The terms of "first", "second", and the like used herein are not intended to indicate any order, quantity, or importance, but rather are used for distinguishing one element from another. Further, the terms "a", "an", "the", and the like used herein do not denote a limitation of quantity, but rather denote the presence of at least one element. The term of "comprising", "including", or the like, means that the element or item preceding the term contains the element or item listed after the term and its equivalent, but does not exclude the presence of other elements or items. The terms "connected", "coupled", and the like are not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

The inventors of the present inventive concept have found that, in the current OLED display device, a distance between adjacent two of the arranged pixels is large such that an opening area of each of the pixels is small under the condition of a same resolution, and thus a display brightness requirement can be met by increasing a driving current. However, operating the OLED display device at the large driving current tends to increase an aging speed of the OLED display device, thereby reducing a lifetime of the OLED display device.

It should be noted herein that a row direction and a column direction only represent different directions in embodiments of the present disclosure, but are not limited to be perpendicular to each other. In the drawings illustrating embodiments of the present disclosure, a case where the row direction and the column direction are perpendicular to each other is shown as merely an example, but does not limit the embodiments of the present disclosure.

In addition, a case where two objects are identical or equal to each other in an embodiment of the present disclosure does not limit to the case where the two objects are exactly the same in size or shape, but may include the case where the two objects are approximately the same or approximately equal to each other within a certain error range.

Before describing a pixel array, a display device, and a high-precision mask according to embodiments of the present disclosure, the concepts of a sub-pixel, a first sub-pixel, a second sub-pixel, a third sub-pixel, and the like, which will be further described later, will be explained first. In an embodiment of the present disclosure, the pixel array refers to an arrangement structure of light emitting devices of (or with or having) different colors in a display substrate, while an arrangement structure of pixel circuits for driving the respective light emitting devices is not limited. Correspondingly, it should be understood that the sub-pixel in an embodiment of the present disclosure refers to a structure of a light emitting device, and the first sub-pixel, the second sub-pixel, and the third sub-pixel represent sub-pixels of three different colors, respectively. In an embodiment of the present disclosure, description may be made by taking an example in which the first sub-pixel is a red sub-pixel, the second sub-pixel is a green sub-pixel, and the third sub-pixel is a blue sub-pixel. However, the example, in which the first sub-pixel is a red sub-pixel, the second sub-pixel is a green sub-pixel, and the third sub-pixel is a blue sub-pixel, does not limit the scope of an embodiment of the present disclosure.

A shape of each sub-pixel is generally determined by an opening of the sub-pixel in a pixel definition layer, and a light emitting layer is formed at least partially in the opening of the sub-pixel. In this way, a shape of a light emitting area of a sub-pixel, i.e., a shape of the sub-pixel referred to in an embodiment of the present disclosure, is defined. When a shape of an opening of a sub-pixel is quadrilateral, a shape of the sub-pixel is quadrilateral.

Figure 3A:
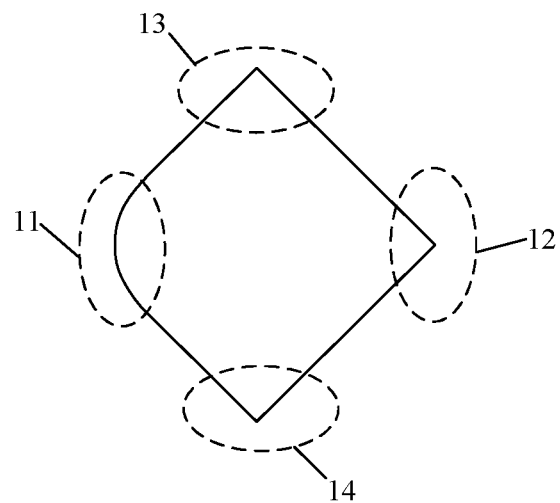
FIG. 3a is a schematic diagram showing a quadrilateral.
Figure 3B:
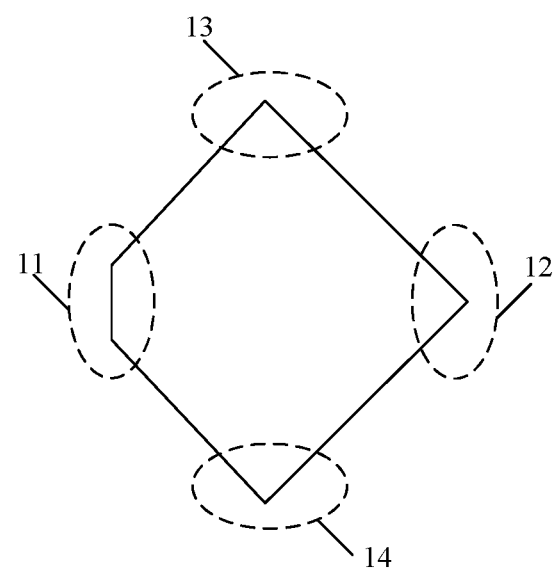
FIG. 3b is a schematic diagram showing another quadrilateral.

In addition, in an embodiment of the present disclosure, the shape of at least one of the red sub-pixel, the green sub-pixel, and the blue sub-pixel includes a polygon. The following embodiment of the present disclosure will be described by taking an example in which the red sub-pixel, the green sub-pixel and the blue sub-pixel are all polygons. Each polygon may have three or more corners depending on a shape of the polygon, and for example, a quadrilateral or a quadrilateral-like shape includes four vertex angles. FIG. 3*a* is a schematic diagram showing a polygon, and FIG. 3*b* is a schematic diagram showing another polygon. As shown in FIGS. 3*a* and 3*b*, each polygon includes four vertex angles, which are a first corner 11, a second corner 12, a third corner 13, and a fourth corner 14. For example, the first corner 11 and the second corner are disposed opposite to each other, and the third corner 13 and the fourth corner 14 are disposed opposite to each other. Of course, it should be understood that, if a sub-pixel has a shape of a polygon, the number of vertex angles of the sub-pixel may alternatively be more than four, which is not limited in an embodiment of the present disclosure. However, it should be noted that a so-called vertex angle in an embodiment of the present embodiment is not necessarily an angle between two straight lines, but actually, portions, which extend toward a vertex of the vertex angle to intersect each other, of two sides of the vertex angle may be formed as an arc line segment or a straight line segment such that the vertex angle becomes circularly chamfered or rectilinearly chamfered. As shown in FIGS. 3*a* and 3*b*, in an embodiment of the present disclosure, description will be made by taking an example in which the first corner 11 of at least one of the blue sub-pixel, the red sub-pixel, and the green sub-pixel is circularly chamfered or rectilinearly chamfered, and the remaining corners thereof are similar to right angles, respectively. However, an embodiment of the present disclosure is not limited to this example. The second corner 12, the third corner 13 and the fourth corner 14 are substantially the same. For example, and the second corner 12, the third corner 13 and the fourth corner 14 are similar to right angles, which means these three corners may be rounded corners but each have curvature radiuses smaller than a curvature radius of the first corner 11. It should be noted that, the second corner 12, the third corner 13 and the fourth corner 14 being substantially the same means that, for example, the three corners have a same angle value, a same contour, a same size, a same curvature of rounded corner, and/or the like.

To make the structure of each sub-pixel in the pixel array according to an embodiment of the present disclosure clearer, a structure of film layers of the pixel array according to an embodiment of the present disclosure will be described in combination with a method for manufacturing the pixel array. FIG. 1 is a schematic diagram showing an exemplary structure of the film layers of the pixel array. As shown in FIG. 1, the method may include the following steps.

(1) A base substrate is formed on a glass carrier plate.

In some exemplary embodiments, the base substrate 010 may be a flexible base substrate, and for example, include a first flexible material layer, a first inorganic material layer, a semiconductor layer, a second flexible material layer, and a second inorganic material layer stacked in sequence on the glass carrier plate. Each of the first flexible material layer and the second flexible material layer is made of polyimide (PI), polyethylene terephthalate (PET), a polymer soft film subjected to surface treatment, or the like. Each of the first inorganic material layer and the second inorganic material layer is made of silicon nitride (SiNx), silicon oxide (SiOx), or the like for improving the water and oxygen resistance of the base substrate, and the first inorganic material layer and the second inorganic material layer are also referred to as barrier layers. A material of the semiconductor layer may be amorphous silicon (a-si). In some exemplary embodiments, the stacked structure may be PI1/Barrier1/a-si/PI2/Barrier2, as an example. A manufacturing process of the stacked structure may include: firstly, coating a polyimide layer on a glass carrier plate, and curing the polyimide layer to form a film as the first flexible layer (PI1); next, depositing a barrier film on the first flexible layer to form a first barrier layer (Barrier1) covering the first flexible layer; then, depositing an amorphous silicon film on the first barrier layer to form an amorphous silicon (a-si) layer covering the first barrier layer; subsequently, coating a polyimide layer on the amorphous silicon layer, and curing the polyimide layer to form a film as the second flexible layer (PI2); thereafter, depositing a barrier film on the second flexible layer to form the second barrier layer (Barrier2) covering the second flexible layer, thereby completing the formation of the base substrate 010, as shown in FIG. 1.

(2) A driving structure layer is formed on the base substrate. The driving structure layer includes a plurality of driving circuits, each of which includes a plurality of transistors and at least one storage capacitor, and for example, each of the plurality of driving circuits may adopt a 2T1C (i.e., 2 transistors and 1 capacitor), 3T1C (i.e., 3 transistors and 1 capacitor) or 7T1C (i.e., 7 transistors and 1 capacitor) design. Illustration will be made by taking an example in which three sub-pixels are included and the driving circuit of each sub-pixel includes only one transistor and one storage capacitor.

In some embodiments, a manufacturing process of the driving structure layer may be the one as described below.

The manufacturing process of the driving circuit is now described by taking a red sub-pixel 01 as an example.

A first insulating film and an active layer film are sequentially deposited on the base substrate 010, and the active layer film is patterned through a patterning process to form a first insulating layer 011 covering the whole base substrate 010 and an active layer pattern arranged on the first insulating layer 011. The active layer pattern includes at least a first active layer.

Next, a second insulating film and a first metal film are sequentially deposited, and the first metal film is patterned through a patterning process to form a second insulating layer 012 covering the active layer pattern and a first gate metal layer pattern disposed on the second insulating layer 012. The first gate metal layer pattern includes at least a first gate electrode and a first capacitor electrode.

Then, a third insulating film and a second metal film are sequentially deposited, and the second metal film is patterned through a patterning process to form a third insulating layer 013 covering the first gate metal layer and a second gate metal layer pattern arranged on the third insulating layer 013. The second gate metal layer pattern includes at least a second capacitor electrode, and a position of the second capacitor electrode corresponds to a position of the first capacitor electrode.

Subsequently, a fourth insulating film is deposited, and patterned through a patterning process to form a fourth insulating layer 014 covering the second gate metal layer pattern. The fourth insulating layer 014 is provided with at least two first through holes, and portions of the fourth insulating layer 014, the third insulating layer 013 and the second insulating layer 012 in the two first through holes are etched away to expose a surface of the first active layer.

Thereafter, a third metal film is deposited, and patterned through a patterning process to form a source-drain metal layer pattern on the fourth insulating layer 014. The source-drain metal layer pattern includes at least a first source electrode and a first drain electrode which are located in a display region. The first source electrode and the first drain electrode may be connected to the first active layer through the first through holes, respectively.

In the driving circuit of each red sub-pixel 01 in the display region, the first active layer, the first gate electrode, the first source electrode, and the first drain electrode may form a first transistor 210, and the first capacitor electrode and the second capacitor electrode may form a first storage capacitor 212. In the above manufacturing process, a driving circuit of each green sub-pixel 02 and a driving circuit of each blue sub-pixel 03 may be simultaneously formed.

In some exemplary embodiments, the first insulating layer 011, second insulating layer 012, third insulating layer 013, and fourth insulating layer 014 may be a single layer, a multi-layer, or a composite layer including any one or more of silicon oxide (SiOx), silicon nitride (SiNx), and silicon oxynitride (SiON). The first insulating layer 011 may be referred to as a buffer layer for improving the water and oxygen resistance of the base substrate. The second insulating layer 012 and the third insulating layer 013 may be referred to as a gate insulator (GI) layer. The fourth insulating layer 014 may be referred to as an interlayer dielectric (ILD) layer. Each of the first metal film, the second metal film and the third metal film is made of a metal material, such as any one or more of silver (Ag), copper (Cu), aluminum (Al), titanium (Ti), and molybdenum (Mo), or made of an alloy of the above metals, such as aluminum neodymium (AlNd) or molybdenum niobium (MoNb), and may have a single-layer structure or a multi-layer composite structure such as Ti/Al/Ti, or the like. The active layer film is made of one or more of amorphous indium gallium zinc oxide (a-IGZO), zinc oxynitride (ZnON), indium zinc tin oxide (IZTO), amorphous silicon (a-Si), polycrystalline silicon (p-Si), hexathiophene, polythiophene, and the like. That is, the present disclosure may be applicable to transistors respectively manufactured based on an oxide technology, a silicon technology, and an organic substance technology.

(3) A planarization layer is formed on the base substrate provided with the above patterns.

In some exemplary embodiments, a planarization film of an organic material is coated on the base substrate 010 on which the above patterns are formed to form a planarization (PLN) layer 015 covering the entire base substrate 010, and a plurality of second through holes are formed in the planarization layer 015 and in the display region through masking, exposing, and developing processes. Portions of the planarization layer 015 in the plurality of second through holes are removed by the developing process to expose a surface of the first drain electrode of the first transistor 210 of the driving circuit of each red sub-pixel 01, a surface of the first drain electrode of the first transistor of the driving circuit of each green sub-pixel 02, and a surface of the first drain electrode of the first transistor of the driving circuit of each blue sub-pixel 03, respectively.

(4) A pattern of a first electrode is formed on the base substrate provided with the above patterns. In some examples, the first electrode is a reflective anode.

In some exemplary embodiments, a conductive film is deposited on the base substrate 010 on which the above patterns are formed, and is patterned through a patterning process to form the pattern of the first electrode. A first anode 213 of each red sub-pixel 01 is connected to the first drain electrode of the first transistor 210 through a second through hole, a second anode 223 of each green sub-pixel 02 is connected to the first drain electrode of the first transistor of the green sub-pixel 02 through a second through hole, and a third anode 233 of each blue sub-pixel 03 is connected to the first drain electrode of the first transistor of the blue sub-pixel 03 through a second through hole.

In some examples, the first electrode may be made of a metal material, such as one or more of magnesium (Mg), silver (Ag), copper (Cu), aluminum (Al), titanium (Ti), and molybdenum (Mo), or made of an alloy of the above metals, such as aluminum neodymium (AlNd) or molybdenum niobium (MoNb), and may have a single-layer structure, or a multi-layer composite structure such as Ti/Al/Ti or the like, or a stack structure of a metal and a transparent conductive material, such as reflective materials of ITO/Ag/ITO, Mo/AlNd/ITO, or the like.

(5) A pixel definition layer (PDL) pattern is formed on the base substrate provided with the above patterns.

In some exemplary embodiments, a pixel definition film is coated on the base substrate 010 on which the above patterns are formed, and is subjected to masking, exposing, and developing processes to form the pixel definition layer pattern. As shown in FIG. 1, a portion of the pixel definition layer 30 in the display region includes a plurality of sub-pixel definition portions 302, and a plurality of openings 301 of the pixel definition layer are formed between every adjacent two of the plurality of sub-pixel definition portions 302. Portions of the pixel definition layer 30 in the plurality of openings 301 are removed by a developing process to expose at least a portion of a surface of the first anode 213 of each red sub-pixel 01, at least a portion of a surface of the second anode 223 of each green sub-pixel 02, and at least a portion of a surface of the third anode 233 of each blue sub-pixel 03, respectively.

In some examples, the pixel definition layer 30 may be made of polyimide, acryl, polyethylene terephthalate, or the like.

(6) A pattern of a post spacer (PS) is formed on the base substrate on which the above patterns are formed.

In some exemplary embodiments, a film of organic material is coated on the base substrate 010 on which the above patterns are formed, and subjected to masking, exposing, and developing processes to form a pattern of a post spacer 34. The spacer post 34 may serve as a support layer configured to support a fine metal mask (FMM) during evaporation coating. In some examples, two adjacent post spacers 34 are spaced apart from each other by one repeating unit along a row direction in which the sub-pixels are arranged. For example, the post spacer 34 may be located between a red sub-pixel 01 and a blue sub-pixel 03 which are adjacent to each other.

(7) An organic functional layer and a second electrode are sequentially formed on the base substrate provided with the above patterns. In some examples, the second electrode is a transparent cathode. Each light emitting element may emit light from a side of the transparent cathode distal to the base substrate 010, thereby actualizing top emission. In some examples, the organic functional layer of each light emitting element includes: a hole injection layer, a hole transport layer, a light emitting layer, and an electron transport layer.

In some exemplary embodiments, on the base substrate 010 on which the above patterns are formed, a hole injection layer 241 and a hole transport layer 242 are sequentially formed through evaporation coating by using an open mask, next a blue light emitting layer 236, a green light emitting layer 226, and a red light emitting layer 216 are sequentially formed through evaporation coating by using the FMM, and then an electron transport layer 243, a cathode 244, and an optical coupling layer 245 are sequentially formed through evaporation coating by using an open mask. The hole injection layer 241, the hole transport layer 242, the electron transport layer 243, and the cathode 244 are all common layers of the plurality of sub-pixels. In some examples, the organic functional layer may further include a microcavity adjustment layer positioned between the hole transport layer and the light emitting layer. For example, after the hole transport layer is formed, a blue microcavity adjustment layer, a blue light emitting layer, a green microcavity adjustment layer, a green light emitting layer, a red microcavity adjustment layer, and a red light emitting layer may be sequentially formed through evaporation coating by using the FMM.

In some exemplary embodiments, the organic functional layer is formed in each sub-pixel region, such that the organic functional layer is connected to a corresponding anode. The cathode is formed on the pixel definition layer and connected to the organic functional layer.

In some exemplary embodiments, the cathode may be made of any one or more of magnesium (Mg), silver (Ag), and aluminum (Al), or made of an alloy of any one or more of the above metals, or made of a transparent conductive material such as indium tin oxide (ITO), or may be a multi-layer composite structure of a metal and a transparent conductive material.

In some exemplary embodiments, the optical coupling layer may be formed on a side of the cathode 244 distal to the base substrate 010, and may be a common layer of the plurality of sub-pixels. The optical coupling layer may cooperate with the transparent cathode to increase light output. For example, a material of the optical coupling layer may be a semiconductor material. However, the present embodiment is not limited thereto.

(8) An encapsulation layer is formed on the base substrate provided with the above patterns.

In some exemplary embodiments, the encapsulation layer is formed on the base substrate 010 on which the above patterns are formed, and may include a first encapsulation layer 41, a second encapsulation layer 42, and a third encapsulation layer 43 that are stacked together sequentially. The first encapsulation layer 41 is made of an inorganic material and covers the cathode 244 in the display region. The second encapsulation layer 42 is made of an organic material. The third encapsulation layer 43 is made of an inorganic material, and covers the first encapsulation layer 41 and the second encapsulation layer 42. However, the present embodiment is not limited thereto. In some examples, the encapsulation layer may be a five-layer structure that is inorganic/organic/inorganic/organic/inorganic.

Figure 2:
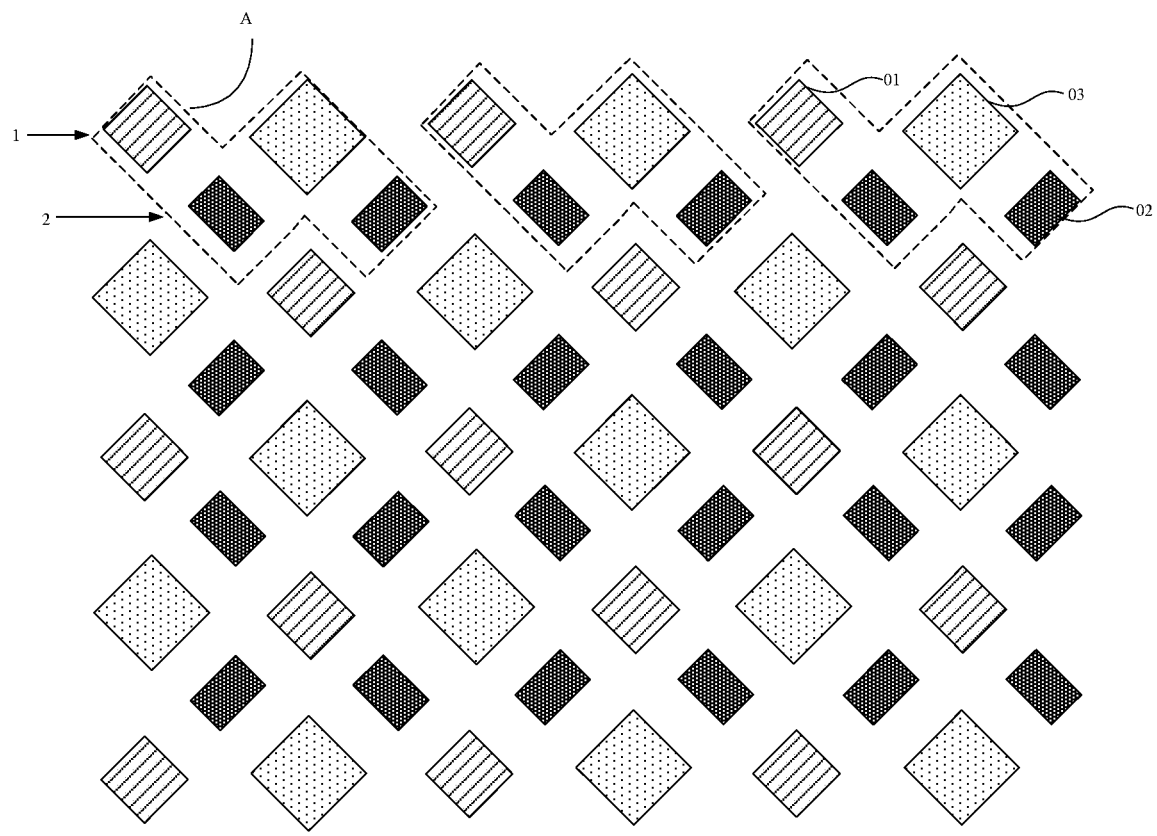
FIG. 2 is a schematic diagram showing an exemplary pixel array.

FIG. 2 shows a schematic diagram of an exemplary pixel array. As shown in FIG. 2, the pixel array includes a plurality of first pixel rows 1 and a plurality of second pixel rows 2, and the first pixel rows 1 and the second pixel rows 2 are alternately arranged. Each first pixel row 1 includes red sub-pixels 01 and blue sub-pixels 03 which are arranged alternately, and the red sub-pixels 01 and the blue sub-pixels 03, which are positioned in a same column, in the plurality of first pixel rows 1 are also arranged alternately. Each second pixel row 2 includes a plurality of green sub-pixels 02 arranged side by side, and the plurality of green sub-pixels 02 are arranged to be staggered with the red sub-pixels 01 and the blue sub-pixels 03 in an adjacent row. For such an arrangement of pixels, the pixel array may be divided into repeating units arranged in an array, and each repeating unit includes two rows and four columns of sub-pixels. That is, each repeating unit includes 1 (i.e., one) red sub-pixel 01, 1 (i.e., one) blue sub-pixel 03, and 2 (i.e., two) green sub-pixels 02, and the red sub-pixel 01 and the blue sub-pixel 03 are common sub-pixels. The 4 sub-pixels may actualize displaying of 2 virtual pixel units through a virtual algorithm. For example, the red sub-pixel 01 in the second repeating unit in a first row, the blue sub-pixel 03 in the first repeating unit in the first row, and the green sub-pixel 02 closest to the red sub-pixel 01 and the blue sub-pixel 03 form a virtual pixel unit, and the red sub-pixel 01 and the blue sub-pixel 03 in the second repeating unit in the first row and the green sub-pixel 02 closest to the red sub-pixel 01 and the blue sub-pixel 03 form a virtual pixel unit; in addition, the blue sub-pixel 03 and the other green sub-pixel 02 in the second repeating unit in the first row and the closest red sub-pixel 01 in the third repeating unit in the first row form a virtual pixel unit. As such, a resolution of a display panel including the pixel array can be improved effectively.

However, the inventors of the present inventive concept have found that, since each of each red sub-pixel 01 and each blue sub-pixel 03 is common sub-pixel and has an area greater than an area of each green sub-pixel 02 according to light emission spectra of each red sub-pixel 01 and each blue sub-pixel 03, in particular, an area of each blue sub-pixel 03 is greater than an area of each red sub-pixel 01, actual brightness centers formed by the virtual pixel units are not uniform when the display panel displays. In view of this, other embodiments of the present disclosure provide the following technical solutions.

Figure 4:
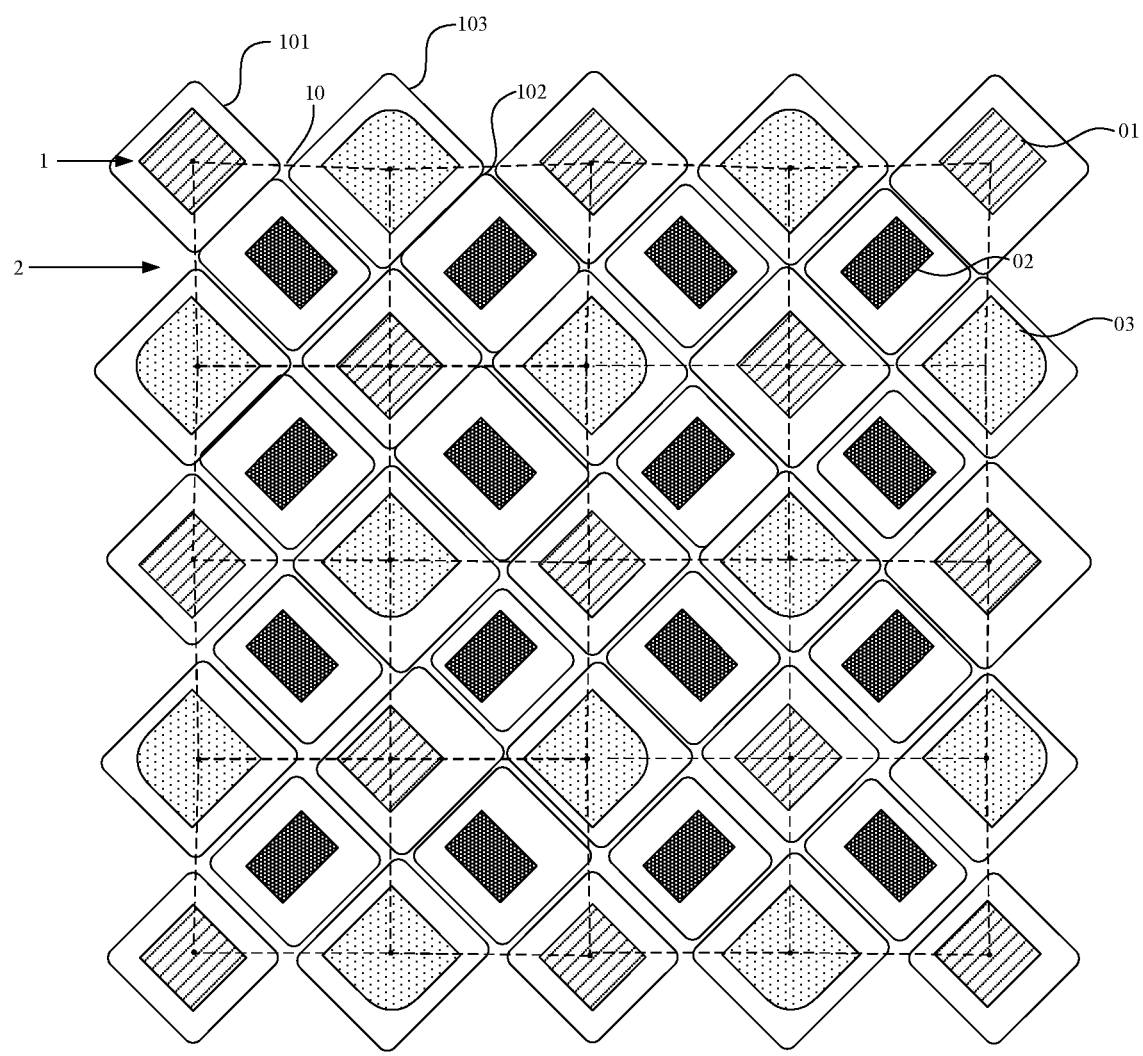
FIG. 4 is a schematic diagram showing a pixel array according to (a first example) of embodiments of the present disclosure.

In a first aspect, FIG. 4 is a schematic diagram showing a pixel array according to (a first example) of embodiments of the present disclosure. As shown in FIG. 4, the pixel array according to the present embodiment includes a plurality of first pixel rows 1 and a plurality of second pixel rows 2, and the plurality of first pixel rows 1 and the plurality of second pixel rows 2 are arranged alternately. Each first pixel row 1 includes red sub-pixels 01 and blue sub-pixels 03 which are arranged alternately, and the red sub-pixels 01 and the blue sub-pixels 03, which are positioned in a same column, in the plurality of first pixel rows 1 are also arranged alternately. Each second pixel row 2 includes a plurality of green sub-pixels 02 arranged side by side, and the plurality of green sub-pixels 02 are arranged to be staggered with the red sub-pixels 01 and the blue sub-pixels 03 in an adjacent row. Lines sequentially connecting centers of two red sub-pixels 01 and two blue sub-pixels 03 which are arranged in an array (i.e., lines sequentially connecting four centers together) form a first virtual quadrilateral (or quadrangle) 10, and a green sub-pixel 02 is arranged within each first virtual quadrilateral 10. For example, at least some interior angles of each first virtual quadrilateral 10 are not equal to 90°. A shape of each of each red sub-pixel 01, each green sub-pixel 02 and each blue sub-pixel 03 includes a polygon. Further, in at least one of each red sub-pixel 01, each green sub-pixel 02 and each blue sub-pixel 03 which is a polygon, a distance between an intersection point of extension lines of two sides of at least one vertex angle and a center of the one sub-pixel is not equal to a distance between an intersection point of extension lines of two sides of the opposite angle of the one vertex angle and the center of the one sub-pixel.

It should be noted that, in an embodiment of the present disclosure, the polygon includes, but is not limited to, a rounded polygon (i.e., a polygon with a rounded corner), a convex polygon, and a concave polygon. A center of a sub-pixel is, for example, a geometric center of the sub-pixel, or an intersection point of perpendicular bisectors of sides of the sub-pixel, or a point in a sub-pixel which has approximately equal vertical distances from sides of the sub-pixel. Of course, the center of a sub-pixel may be allowed to have a certain error. For example, the center of a sub-pixel may be any point within a circle having the geometric center of the sub-pixel as a center and having a radius of 3 μm.

In the present embodiment, the shapes of some of the sub-pixels are adjusted such that at least some interior angles of each first virtual quadrilateral 10, which is formed by lines sequentially connecting centers of two red sub-pixels 01 and two blue sub-pixels 03 which are arranged in an array, are not equal to 90°, and the distance between the intersection point of extension lines of two sides of at least one vertex angle in at least one of each red sub-pixel 01, each green sub-pixel 02 and each blue sub-pixel 03 and the center of the one sub-pixel is not equal to the distance between the intersection point of extension lines of two sides of the opposite angle of the one vertex angle and the center of the one sub-pixel, thereby adjusting the actual brightness center of each virtual pixel unit, and making the distribution of the actual brightness centers in an entire display panel more uniform.

In some embodiments, if a first corner of each blue sub-pixel 03 is circularly chamfered or rectilinearly chamfered, a distance between the vertex of the first corner of each blue sub-pixel 03 and a boundary of the light emitting layer is different from each of the distances between the vertexes of other corners of each blue sub-pixel 03 and the boundary of the light emitting layer. For example, the vertex of the first corner of each blue sub-pixel 03 has a certain distance from a boundary of the pixel, while the vertex of each of the other corners of each blue sub-pixel 03 has a distance of approximately 0 from the boundary. That is, the distance between the vertex of the first corner of each blue sub-pixel 03 and the boundary is greater than the distance between the vertex of another corner and the boundary of the blue sub-pixel 03.

With further reference to FIG. 4, the light emitting layers in the pixel definition layer define effective light emitting areas of the sub-pixels, respectively, and the effective light emitting areas of each red sub-pixel 01, each green sub-pixel 02 and each blue sub-pixel 03 are a first effective light emitting area, a second effective light emitting area and a third effective light emitting area, respectively. In some embodiments, each first effective light emitting area is defined by a light emitting layer which is in a corresponding red sub-pixel 01, is located between the anode and the cathode opposite to each other in a direction perpendicular to the base substrate, and is to be driven to emit light. For example, each second effective light emitting area is defined by a light emitting layer which is in a corresponding green sub-pixel 02, is located between the anode and the cathode opposite to each other in the direction perpendicular to the base substrate, and is to be driven to emit light. In some embodiments, each effective light emitting area is defined by a corresponding light emitting layer and an electrode (the anode or the cathode) or a portion of the electrode that transports carriers (holes or electrons) with (from/to) the corresponding light emitting layer. In some embodiments, each effective light emitting area is defined by at least a portion of the cathode and at least a portion of the anode, an orthogonal projection of the at least a portion of the cathode on the base substrate and an orthogonal projection of the at least a portion of the anode on the base substrate overlap each other, the orthogonal projections of the at least a portion of the cathode and the at least a portion of the anode on the base substrate do not overlap an orthogonal projection of a first insulating layer on the base substrate, and the first insulating layer is located between the cathode and the anode in the direction perpendicular to the base substrate. For example, the first insulating layer includes the pixel definition layer. In some embodiments, each of each red sub-pixel 01, each green sub-pixel 02 and each blue sub-pixel 03 includes a first electrode, a light emitting layer on a side of the first electrode distal to the base substrate, and a second electrode on a side of the light emitting layer distal to the first electrode. A second insulating layer is arranged between the first electrode and the light emitting layer and/or between the second electrode and the light emitting layer, in the direction perpendicular to the base substrate. A projection of the second insulating layer on the base substrate overlaps a projection of the first electrode or the second electrode on the base substrate. Further, the second insulating layer has an opening, and the opening of the second insulating layer may expose at least a portion of the first electrode or a portion of the second electrode on the side proximal to the light emitting layer, such that the first electrode or the second electrode is in contact with the light emitting layer or the functional layer facilitating light emission. Each of each first effective light emitting area and each second effective light emitting area is defined by a portion of the first electrode or a portion of the second electrode in contact with the light emitting layer or the functional layer facilitating light emission. In some embodiments, the second insulating layer includes the pixel definition layer. In some embodiments, the functional layer facilitating light emission may be any one or more of the hole injection layer, the hole transport layer, the electron transport layer, a hole blocking layer, an electron blocking layer, an electron injection layer, an auxiliary light emitting layer, an interface improving layer, an anti-reflection layer, and the like. In some embodiments, the first electrode may be the anode and the second electrode may be the cathode. In some embodiments, the first electrode may include at least two laminated layers of indium tin oxide (ITO) and silver (Ag), and for example, may be a three laminated layers of ITO, Ag and ITO. In some embodiments, the second electrode may include any one or more of magnesium (Mg), Ag, ITO, and indium zinc oxide (IZO), and for example, may be a mixed layer or an alloy layer of Mg and Ag.

Each sub-pixel includes a light emitting layer. Each red sub-pixel 01 includes a first color light emitting layer in an opening and on the pixel definition layer, and each green sub-pixel 02 includes a second color light emitting layer in an opening and on the pixel definition layer.

For example, an arrangement in which four of the green sub-pixels 02 surround one of the red sub-pixels 01 may be an arrangement in the interior of the display region, and an arrangement at an edge of the display region may be different from the arrangement in the interior of the display region. For example, at the edge of the display region, in a case where the red sub-pixel 01 is a sub-pixel in the first row or the first column or the last row or the last column, only two of the green sub-pixels 02 may surround the red sub-pixel 01. For example, the edge of the display region may include a rounded corner or the display region is a special-shaped display region, such as a non-rectangular display region like a circular display region, or a rectangular display region with a hole formed near a boundary of the rectangular display region. In this case, at the edge of the display region, one of the red sub-pixels 01 may be surrounded by one, two or three of the green sub-pixels 02.

In some embodiments, the light emitting layer 101 of each red sub-pixel, the light emitting layer 102 of each green sub-pixel, and the light emitting layer 103 of each blue sub-pixel may have a same or substantially the same shape. Each light emitting layer in the pixel definition layer defines an effective light emitting area of each sub-pixel.

In an embodiment of the present disclosure, the first corner of each blue sub-pixel 03 may be circularly chamfered or rectilinearly chamfered, and the distance between the vertex of the first corner of each blue sub-pixel 03 and the boundary of the corresponding light emitting layer is different from the distance between the vertex of each of the other corners thereof and the boundary of the corresponding light emitting layer. For example, the distance between the vertex of the first corner of each blue sub-pixel 03 and the boundary of the corresponding light emitting layer is greater than the distance between the vertex of each of the other corners thereof and the boundary of the corresponding light emitting layer.

In some embodiments, the minimum distances between a center of a green sub-pixel 02 in each first virtual quadrilateral 10 and the boundaries of the light emitting areas of the two red sub-pixels 01 directly adjacent to the green sub-pixel 02 are equal to each other. In addition, the minimum distances between the center of the green sub-pixel 02 and the boundaries of the light emitting areas of the two blue sub-pixels 03 directly adjacent to the green sub-pixel 02 are also equal to each other. For example, a ratio of the minimum distances between the center of the green sub-pixel 02 and the boundaries of the light emitting areas of the two red sub-pixels 01 directly adjacent to the green sub-pixel 02 to the minimum distances between the center of the green sub-pixel 02 and the boundaries of the light emitting areas of the two blue sub-pixels 03 directly adjacent to the green sub-pixel 02 ranges from about 0.8 to about 1.2.

Figure 5:
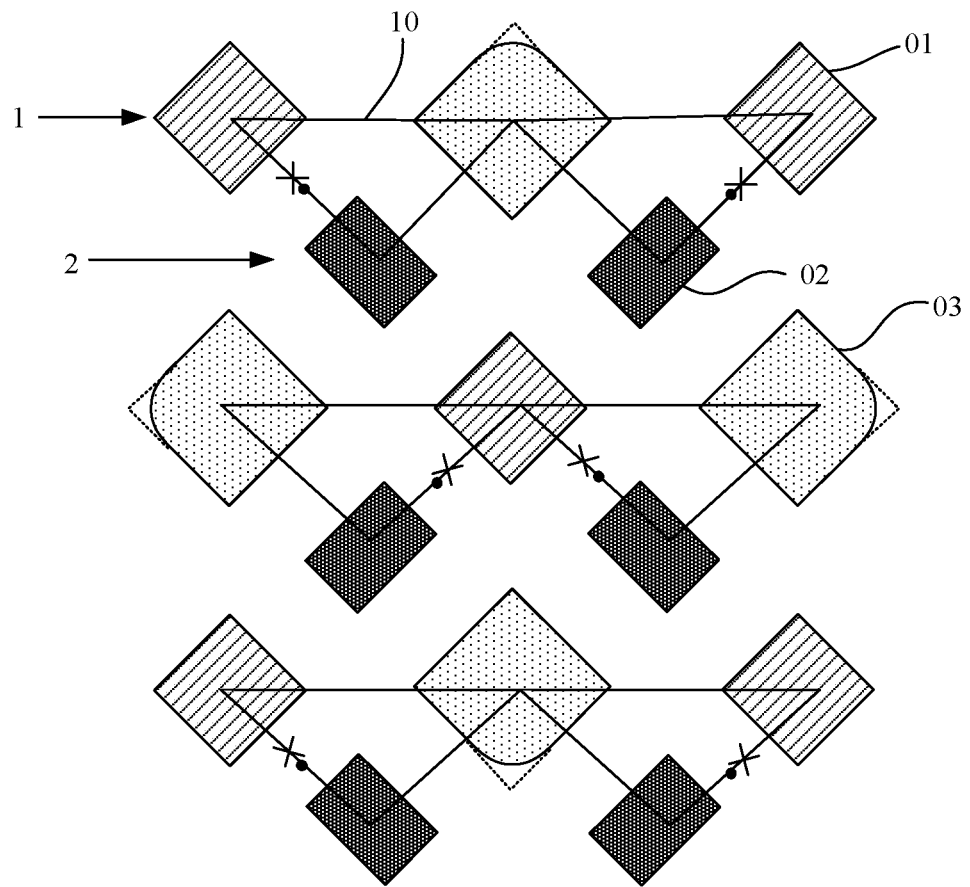
FIG. 5 is a schematic diagram showing the distribution of actual brightness centers of a pixel array, during displaying, with a first corner of each blue sub-pixel being rounded (i.e., circularly chamfered) and being similar to a right angle, according to an embodiment of the present disclosure.

Specifically, FIG. 5 is a schematic diagram showing the distribution of actual brightness centers of a pixel array, during displaying, with the first corner of each blue sub-pixel 03 being rounded (i.e., circularly chamfered) and being similar to a right angle, according to an embodiment of the present disclosure. As shown in FIG. 5, for example, the first corners of all of the blue sub-pixels in the pixel array may be directed to the right. In FIG. 5, the dotted line corner at the first corner of each blue sub-pixel 03 in FIG. 5 represents a pixel array in the related art in which the first corner of each blue sub-pixel 03 is similar to a right angle, symbols "X" represent actual brightness centers when the pixel array in the related art displays, and symbols "•" represent the actual brightness centers of the pixel array according to an embodiment of the present disclosure when displaying. As can be seen from FIG. 5, when the first corners of the blue sub-pixels are rounded, the distribution of the actual brightness centers thereof is more uniform.

In some embodiments, each of the interior angles of each first virtual quadrilateral 10 ranges from about 70° to about 110°, and may be closer to 90° to be better. However, each of the interior angles of each first virtual quadrilateral 10 is not limited to be in the range of 70° to 110°, as long as not all of the interior angles of each first virtual quadrilateral 10 are equal to 90°.

In some embodiments, each first virtual quadrilateral 10 includes, but is not limited to, a virtual parallelogram or a virtual trapezoid. For example, each first virtual quadrilateral 10 may be any one of a rhombus, an isosceles trapezoid, and a right trapezoid (which may also be referred to as a right-angled trapezoid).

Figure 6:
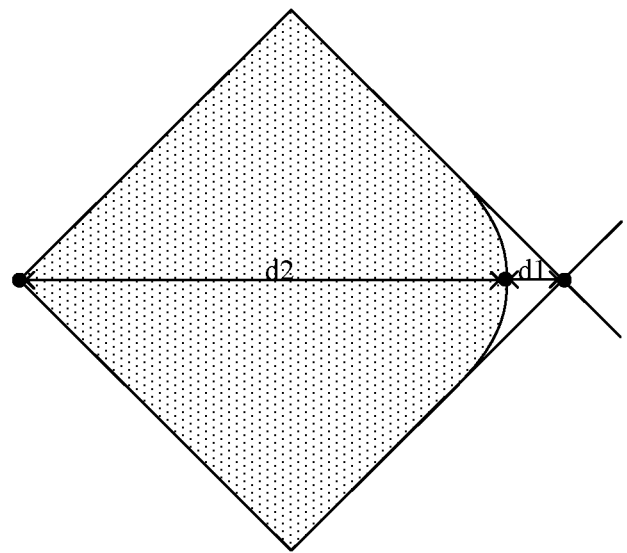
FIG. 6 is a schematic diagram showing a blue sub-pixel according to an embodiment of the present disclosure.

In some embodiments, FIG. 6 is a schematic diagram showing a blue sub-pixel according to an embodiment of the present disclosure. As shown in FIG. 6, the first corner of a blue sub-pixel 03 is rounded (i.e., circularly chamfered) or rectilinearly chamfered. A distance between an intersection point of extension lines of two sides of the first corner and a vertex of the first corner is d1, and a distance between the vertex of the first corner and a vertex of the second corner is d2, d1/d2 ranging from about 1/5 to about 1/2. For example, the vertex of the first corner of a blue sub-pixel 03 is a point, which has the minimum distance from the intersection point of the extension lines of the two sides of the corresponding vertex angle, at a boundary of the blue sub-pixel. Similarly, in a case where the first corner of each of a red sub-pixel 01 and a green sub-pixel 02 is circularly chamfered or rectilinearly chamfered, a distance between an intersection point of extension lines of two sides of the first corner thereof and a vertex of the first corner and a distance between the vertex of the first corner and a vertex of the second corner may be set according to the above-described dimensions (or sizes).

In some embodiments, virtual vertex angles formed by intersection of extension lines of two sides of respective vertex angles of the second corner, the third corner and the fourth corner of a blue sub-pixel 03 are approximately equal to each other, and may be about 90°, for example, may be about 80° to about 100°.

In some embodiments, an area surrounded by the extension lines of the two sides of the vertex angle of the first corner of a blue sub-pixel 03 and a contour of the first corner is a first hollowed-out area, and an area surrounded by the extension lines of the two sides of the vertex angle of the second corner of the blue sub-pixel 03 and a contour of a boundary of the second corner is a second hollowed-out area, the first hollowed-out area being greater than the second hollowed-out area in area.

In addition, an area surrounded by extension lines of two sides of a vertex angle of the third corner of the blue sub-pixel 03 and a contour of a boundary of the third corner is a third hollowed-out area, and an area surrounded by extension lines of two sides of a vertex angle of the fourth corner of the blue sub-pixel 03 and a contour of a boundary of the fourth corner is a fourth hollowed-out area. In some embodiments, the second, third, and fourth hollowed-out areas are approximately equal to each other in area. For example, an area of each of the second hollowed-out area, the third hollowed-out area and the fourth hollowed-out area is less than 4 $\mu m^2$, and an area of the first hollowed-out area is greater than 2 $\mu m^2$.

Figure 7:
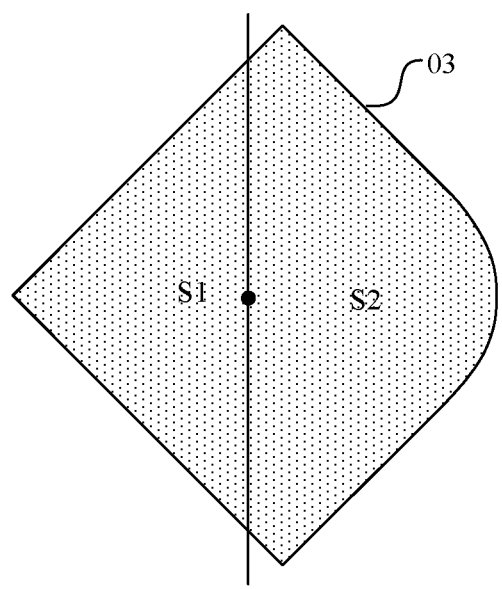
FIG. 7 is a schematic diagram showing a blue sub-pixel according to an embodiment of the present disclosure.

In some embodiments, FIG. 7 is a schematic diagram showing a blue sub-pixel according to the embodiments of the present disclosure. As shown in FIG. 7, the first corner of a blue sub-pixel 03 is circularly chamfered or rectilinearly chamfered. A straight line passing through the center of the blue sub-pixel 03 along the row direction of the pixel array divides the blue sub-pixel 03 into two parts having areas S1 and S2, respectively, and a ratio of S1:S2 ranges from about 2:8 to about 8:2. Alternatively, a straight line passing through the center of the blue sub-pixel 03 along the column direction of the pixel array divides the blue sub-pixel 03 into two parts having areas S1 and S2, respectively, and a ratio of S1:S2 ranges from about 2:8 to about 8:2. Similarly, in a case where the first corner of each of a red sub-pixel 01 and a green sub-pixel 02 is circularly chamfered or rectilinearly chamfered, a straight line passing through the center of each of the red sub-pixel 01 and the green sub-pixel 02 along the row or column direction of the pixel array divides each of the red sub-pixel 01 and the green sub-pixel 02 into two parts having the same ratio as the ratio of the areas of the two parts of the blue sub-pixel 03.

In some embodiments, as shown in FIG. 6, the first corner of a blue sub-pixel is circularly chamfered or rectilinearly chamfered, and the extension lines of the two sides of the first corner form a virtual vertex angle of about 90°; and in some embodiments, the virtual vertex angle ranges from about 80° to about 100°. Similarly, in a case where the first corner of each of a red sub-pixel 01 and a green sub-pixel 02 is circularly chamfered or rectilinearly chamfered, the extension lines of the two sides of the respective first corner of each of the red sub-pixel 01 and the green sub-pixel 02 form an angle substantially the same as the virtual vertex angle formed by the extension lines of the two sides of the first corner of the blue sub-pixel 03.

Figure 8:
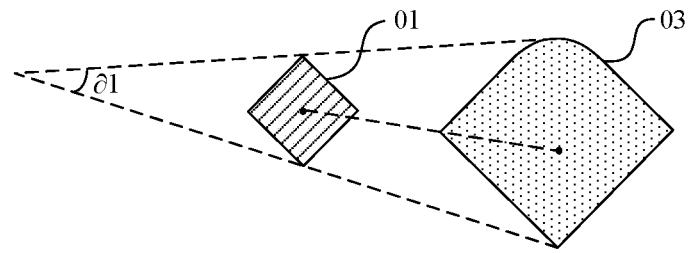
FIG. 8 is a schematic diagram showing a red sub-pixel and a blue sub-pixel disposed adjacent to each other in a same row according to an embodiment of the present disclosure.

In some embodiments, a line connecting opposite angles in the row direction of a red sub-pixel 01 and a blue sub-pixel 03 in a same row is substantially on a same straight line or forms an angle of about 30° with the row direction. In addition, in some embodiments, FIG. 8 is a schematic diagram showing a red sub-pixel and a blue sub-pixel that are adjacently disposed in a same row according to the embodiments of the present disclosure. As shown in FIG. 8, in the first pixel row 1, e.g., in a red sub-pixel 01 and a blue sub-pixel 03 that are adjacently disposed in a same row, an extension line of a line connecting end points farthest from respective centers on a first side (i.e., the upper side) in the column direction intersects an extension line of a line connecting end points farthest from respective centers on an opposite second side (i.e., the lower side), with an angle 61 less than 30° therebetween.

Figure 9:
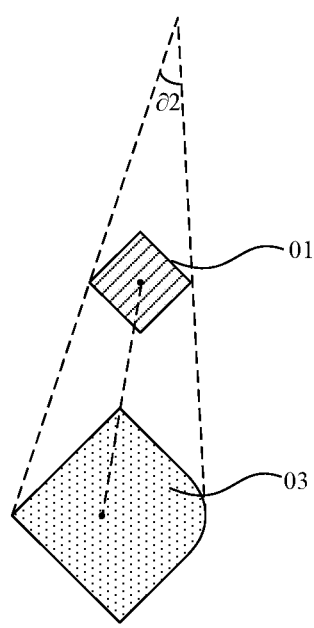
FIG. 9 is a schematic diagram showing a red sub-pixel and a blue sub-pixel disposed adjacent to each other in a same column according to an embodiment of the present disclosure.

In some embodiments, FIG. 9 is a schematic diagram showing a red sub-pixel and a blue sub-pixel arranged adjacently in a same column according to the embodiments of the present disclosure. As shown in FIG. 9, in a red sub-pixel 01 and a blue sub-pixel 03 arranged adjacently in a same column, an extension line of a line connecting end points farthest from respective centers on a first side (i.e., the left side) in the row direction intersects an extension line of a line connecting end points farthest from respective centers on an opposite second side (i.e., the right side), with an angle δ2 less than 30° therebetween.

Figure 10:
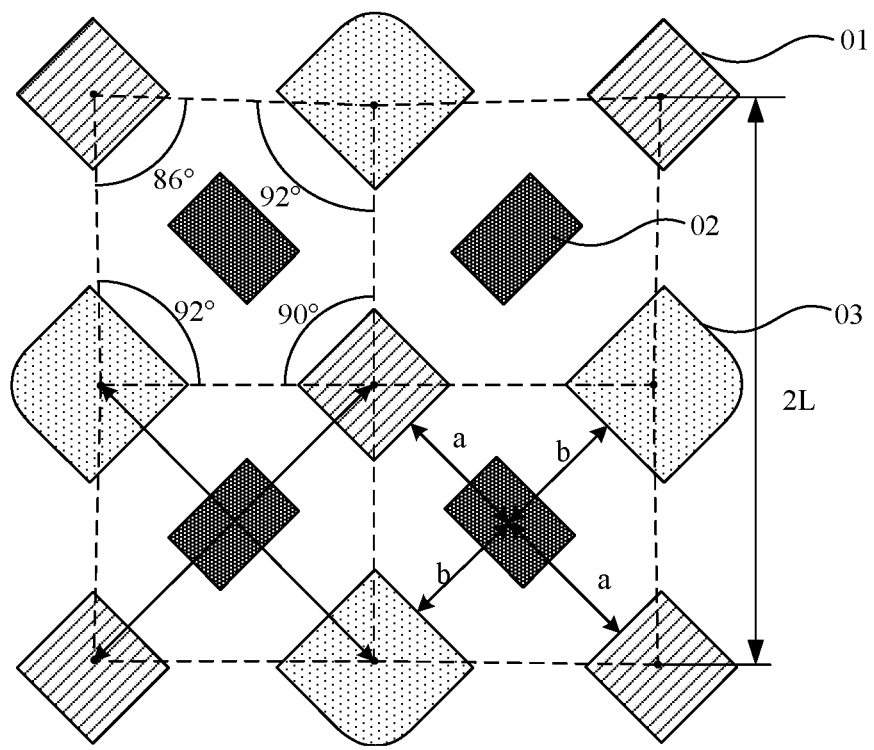
FIG. 10 is a schematic diagram showing the distribution of sub-pixels in a first one, which is at the top left corner of the pixel array shown in FIG. 4, of second virtual quadrilaterals of the pixel array.

In some embodiments, for a red sub-pixel 01 and a blue sub-pixel 03 adjacent to each other in a same row, at least one corner of the red sub-pixel 01 and at least one corner of the blue sub-pixel 03 are opposite to each other, and an intersection point of extension lines of two sides of the at least one corner of the red sub-pixel 01 and an intersection point of extension lines of two sides of the at least one corner of the blue sub-pixel 03 are located on a straight line parallel to the row direction. Additionally/alternatively, for a red sub-pixel 01 and a blue sub-pixel 03 adjacent to each other in a same column, at least one corner of the red sub-pixel 01 and at least one corner of the blue sub-pixel 03 are opposite to each other, and an intersection point of extension lines of two sides of the at least one corner of the red sub-pixel 01 and an intersection point of extension lines of two sides of the at least one corner of the blue sub-pixel 03 are located on a straight line parallel to the column direction. In some embodiments, four first virtual quadrilaterals 10 arranged in an array form a second virtual polygon. For example, as shown in FIG. 10, the second virtual polygon formed by four first virtual quadrilaterals 10 arranged in an array has a structure of a quadrilateral such as a rectangle (including a square). Alternatively, the second virtual polygon is not limited to a quadrilateral, and may be a hexagon or another polygon with more than four sides. In an embodiment of the present disclosure, description is made by taking an example in which the second virtual polygon is a quadrilateral and is referred to as a second virtual quadrilateral 100 below. The four green sub-pixels 02 in the second virtual quadrilateral 100 are arranged in an X-shape. That is, the green sub-pixels 02 located in a same row in the second virtual quadrilateral 100 are symmetrically disposed with respect to the column direction, and the green sub-pixels 02 in a same column in the second virtual quadrilateral 100 are symmetrically disposed with respect to the row direction. In some embodiments, the red sub-pixels 01 in the second virtual quadrilateral 100 are located at a center and vertex angles of the second virtual quadrilateral 100, respectively. The blue sub-pixels 03 in the second virtual quadrilateral 100 are located at sides of the second virtual quadrilateral 100. Further, the red sub-pixels 01 located at the vertex angles of the second virtual quadrilateral 100 and the blue sub-pixels 03 located at the sides of the second virtual quadrilateral 100 are alternately distributed at the vertex angles and the sides of the second virtual quadrilateral 100 in the clockwise direction.

In some embodiments, in the second virtual quadrilateral 100, the centers of the blue sub-pixels 03 located in a same row are substantially on a straight line parallel to the row direction, and/or the centers of the blue sub-pixels 03 located in a same column are substantially on a straight line parallel to the column direction.

In some embodiments, in the second virtual quadrilateral 100, the centers of the green sub-pixels 02 located in a same row are substantially on a straight line parallel to the row direction, and/or the centers of the green sub-pixels 03 located in a same column are substantially on a straight line parallel to the column direction.

In some embodiments, in the pixel array, the red sub-pixels 01 have a same shape, the green sub-pixels 02 have a same shape, and the blue sub-pixels 03 have a same shape. Alternatively, the sub-pixels with a same color may be structures of different shapes, and the structures of different shapes are uniformly distributed in the sub-pixels with a same color. For example, the red sub-pixels 01 in every other row or every other column have a same shape.

In some embodiments, if the first corner of each blue sub-pixel 03 is circularly chamfered or rectilinearly chamfered, orientations of the first corners of some or all of the blue sub-pixels 03 in the pixel array may be the same. For example, the first corners of the blue sub-pixels 03 in a same row have a same orientation, the first corners of the blue sub-pixels 03 in a same column have different orientations. Similarly, the first corners of the green sub-pixels 02 and the red sub-pixels 01, when being circularly chamfered or rectilinearly chamfered, may have the same orientations as the orientations of the first corners of the blue sub-pixels 03.

An embodiment of the present disclosure provides a pixel array, which is substantially the same as the above pixel array. The pixel array includes a plurality of sub-pixels, which include red sub-pixels 01, green sub-pixels 02 and blue sub-pixels 03. The red sub-pixels 01 and the blue sub-pixels 03 are alternately arranged along the row direction to form a plurality of first pixel rows 1, and the red sub-pixels 01 and the blue sub-pixels 03, which are positioned in a same column, in the plurality of first pixel rows 1 are alternately arranged. The green sub-pixels 02 are arranged side by side in the row direction to form a plurality of second pixel rows 2. Lines sequentially connecting centers of two red sub-pixels 01 and two blue sub-pixels arranged in an array to each other form a first virtual quadrilateral 10, and a green sub-pixel is arranged in each first virtual quadrilateral 10. For example, at least some of the interior angles of the first virtual quadrilateral 10 are not equal to 90°. A shape of each of a red sub-pixel 01, a green sub-pixel 02 and a blue sub-pixel 03 includes a polygon. The minimum distance between the intersection point of extension lines of two sides of at least one vertex angle in at least one sub-pixel, which has a shape of a polygon, of the red sub-pixel 01, the green sub-pixel 02 and the blue sub-pixel 03 and the boundary of the at least one sub-pixel is not equal to the minimum distance between the intersection point of extension lines of two sides of another vertex angle of the at least one sub-pixel and the boundary of the at least one sub-pixel. For example, referring to FIG. 6, the first corner of a blue sub-pixel 03 is circularly chamfered or rectilinearly chamfered, and the distance between the intersection point of the extension lines of the two sides of the first corner and the vertex of the first corner is d1, and the distance between the vertex of the first corner and the vertex of the second corner is d2, a ratio of d1/d2 ranges from about 1/5 to about 1/2. For example, the vertex of the first corner of the blue sub-pixel 03 is a point, which is at the boundary of the blue sub-pixel 03, with the minimum distance from the intersection point of the extension lines of the two sides of the vertex angle of the blue sub-pixel 03.

In some embodiments, each red sub-pixel 01 is axisymmetric, the red sub-pixels 01 have a same shape, but symmetry axes of at least some of the red sub-pixels 01 are not in a same direction. Alternatively, each green sub-pixel 02 is axisymmetric, the green sub-pixels 02 have a same shape, but symmetry axes of at least some of the green sub-pixels 02 are not in a same direction. Alternatively, each blue sub-pixel 03 is axisymmetric, the blue sub-pixels 03 have a same shape, but symmetry axes of at least some of the blue sub-pixels 03 are not in a same direction. For example, the first corner of each of the blue sub-pixels 03 is circularly chamfered or rectilinearly chamfered, and the blue sub-pixels 03 in the pixel array have a same shape. The orientations of the first corners of the blue sub-pixels 03 are different, and for example, the orientations of some of the first corners are directed upward while the orientations of some of the first corners are directed to the left. The symmetry axes of the blue sub-pixels 03 whose first corners are directed upward are parallel to the column direction, while the symmetry axes of the blue sub-pixels 03 whose first corners are directed to the left are parallel to the row direction. That is, the symmetry axes of the blue sub-pixels 03 whose first corners are directed upward and to the left are not in a same direction.

In some embodiments, the red sub-pixels 01 and the blue sub-pixels 03 are axisymmetric, and the symmetry axes of at least some of the red sub-pixels 01 and the blue sub-pixels 03 are not in a same direction. For example, the first corners of the red sub-pixels 01 and the blue sub-pixels 03 are all circularly chamfered or rectilinearly chamfered. The first corners of some of the red sub-pixels 01 have orientations directed upward, and have symmetry axes parallel to the column direction. The first corners of some of the blue sub-pixels 03 have orientations directed to the left, and have symmetry axes parallel to the row direction. That is, the symmetry axes of the red sub-pixels 01 and the blue sub-pixels 03 whose first corners are directed in different directions are not in a same direction.

In some embodiments, each green sub-pixel 02 may be asymmetric, and for example, may be a right trapezoid or the like.

In some embodiments, a shape of at least one of a red sub-pixel 01 and a blue sub-pixel 03 includes only one symmetry axis. For example, a first corner of the shape of at least one of a red sub-pixel 01 and a blue sub-pixel 03 is circularly chamfered or rectilinearly chamfered, and a second corner, a third corner, and a fourth corner of the at least one of a red sub-pixel 01 and a blue sub-pixel 03 have substantially the same shape. In this case, the shape of the at least one of a red sub-pixel 01 and a blue sub-pixel 03 includes only one symmetry axis.

In some embodiments, at least two of the number of symmetry axes of the shape of a red sub-pixel 01, the number of symmetry axes of the shape of a green sub-pixel 02, and the number of symmetry axes of the shape of a blue sub-pixel 03 are different. For example, one of the red sub-pixel 01, the green sub-pixel 02 and the blue sub-pixel 03 may be axisymmetric, and the other two may not be axisymmetric. Alternatively, two of the red sub-pixel 01, the green sub-pixel 02 and the blue sub-pixel 03 may be axisymmetric, and the third one may not be axisymmetric. Alternatively, all of the red sub-pixel 01, the green sub-pixel 02 and the blue sub-pixel 03 may be axisymmetric, but the number of symmetry axes of the red sub-pixel 01, the number of symmetry axes of the green sub-pixel 02 and the number of symmetry axes of the blue sub-pixel 03 are different from each other, for example, are one, two and four, respectively. Alternatively, all of the red sub-pixel 01, the green sub-pixel 02 and the blue sub-pixel 03 may be axisymmetric, but the number of symmetry axes of one of the red sub-pixel 01, the green sub-pixel 02 and the blue sub-pixel 03 is different from the number of symmetry axes of each of the other two of the red sub-pixel 01, the green sub-pixel 02 and the blue sub-pixel 03, for example, one of the red sub-pixel 01, the green sub-pixel 02 and the blue sub-pixel 03 has two or four symmetry axes, while each of the other two of the red sub-pixel 01, the green sub-pixel 02 and the blue sub-pixel 03 has one symmetry axis. The pixel array according to an embodiment of the present disclosure will be further described below with reference to specific examples.

In a first example, FIG. 10 is a schematic diagram showing the distribution of sub-pixels in a first second virtual quadrilateral (i.e., a first one of second virtual quadrilaterals) that is in the upper left corner of the pixel array shown in FIG. 4. For example, as shown in FIG. 10, only the arrangement of the sub-pixels in one second virtual quadrilaterals 100 is illustrated. As shown in FIGS. 4 and 10, each second virtual quadrilateral 100 includes four first virtual quadrilaterals 10, adjacently disposed first virtual quadrilaterals 10 have a common side, and adjacently disposed second virtual quadrilaterals 100 have a common side. Each first virtual quadrilateral 10 is formed by lines sequentially connecting centers of two red sub-pixels 01 and two blue sub-pixels 03 which are arranged in an array, i.e., four vertex angles of each first virtual quadrilateral 10 are respectively provided with two red sub-pixels 01 and two blue sub-pixels 03. For example, the two red sub-pixels 01 are arranged at two opposite vertex angles of a first virtual quadrilateral 10, the two blue sub-pixels 03 are arranged at the other two opposite vertex angles of the first virtual quadrilateral 10, and the center of the first virtual quadrilateral 10 is provided with one green sub-pixel 02. For the arrangement of the sub-pixels in a second virtual quadrilateral 100, red sub-pixels 01 are arranged at the center and four vertex angles of the second virtual quadrilateral 100, and one blue sub-pixel 03 is arranged between two red sub-pixels 01 in each of the row direction and the column direction.

As shown in FIG. 10, the first corner of a blue sub-pixel 03 is rounded (i.e., circularly chamfered), and the second corner, the third corner and the fourth corner thereof are all similar to right angles, respectively. For each second virtual quadrilateral 100, the two blue sub-pixels located in a same row are symmetrically arranged with respect to the column direction, and the two blue sub-pixels 03 located in a same column are symmetrically arranged with respect to the row direction. The first corners of the blue sub-pixels 03 in one of two adjacent first pixel rows 1 are oriented in (or directed to) a same direction, and the first corners of the blue sub-pixels 03 in the other of the two adjacent first pixel rows 1 are oriented in (or directed to) opposite directions, respectively.

As shown in FIG. 10, a first one, which is at the top left corner, of the first virtual quadrilaterals 10 has a pair of equal angles (each of which is 92° as shown) and another angle of 90°, and each of the remaining first virtual quadrilaterals 10 has at least one angle of 90° and the vertex of the angle of 90° is located at the center of a red sub-pixel; and the blue sub-pixels 03 disposed diagonally around a red sub-pixel 01 are symmetric with respect to the center of the red sub-pixel 01.

As shown in FIG. 10, if a line connecting centers of a red sub-pixel 01 and a blue sub-pixel 03 adjacently disposed in a same column to each other has a length of L, a second virtual quadrilateral 100 is a square (which is a substantial square here) with a side of 2L and a center thereof is provided with a red sub-pixel 01, and the center of a green sub-pixel 02 in each first virtual quadrilateral 10 is located on a perpendicular bisector of a line connecting centers of a red sub-pixel 01 and a blue sub-pixel 03 adjacently disposed in the row direction or the column direction to each other. In addition, as shown in FIG. 10, vertical distances from the center of a green sub-pixel 02 to the boundaries of the light emitting areas of a red sub-pixel 01 and a blue sub-pixel 03 in each first virtual quadrilateral 10 are a and b, respectively, where a=b.

Figure 11:
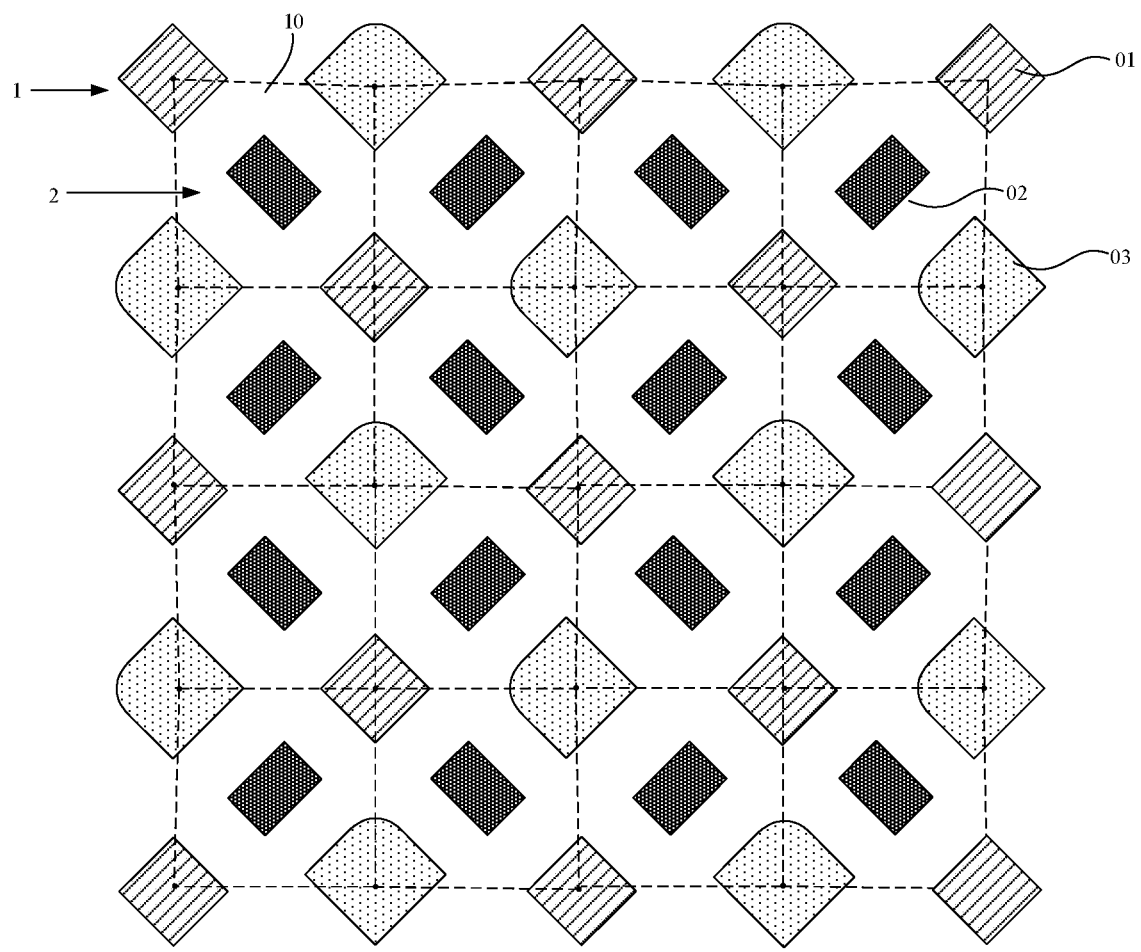
FIG. 11 is a schematic diagram showing a pixel array according to a second example of embodiments of the present disclosure.

In a second example, FIG. 11 is a schematic diagram showing a pixel array according to the second example of embodiments of the present disclosure. As shown in FIG. 11, positions and shapes of sub-pixels in this pixel array are the same as the positions and shapes of the sub-pixels in the pixel array according to the first example, except that the first corners of some of the blue sub-pixels 03 are oriented (or directed) differently. In this pixel array, the orientations of the first corners of the blue sub-pixels 03 located in a same row are the same, and the orientations of the first corners of the blue sub-pixels 03 located in a same column are the same. For example, in FIG. 11, the first corners of the blue sub-pixels 03 in the first row are directed upward, and the first corners of the blue sub-pixels 03 in the first column are directed to the left.

Figure 12:
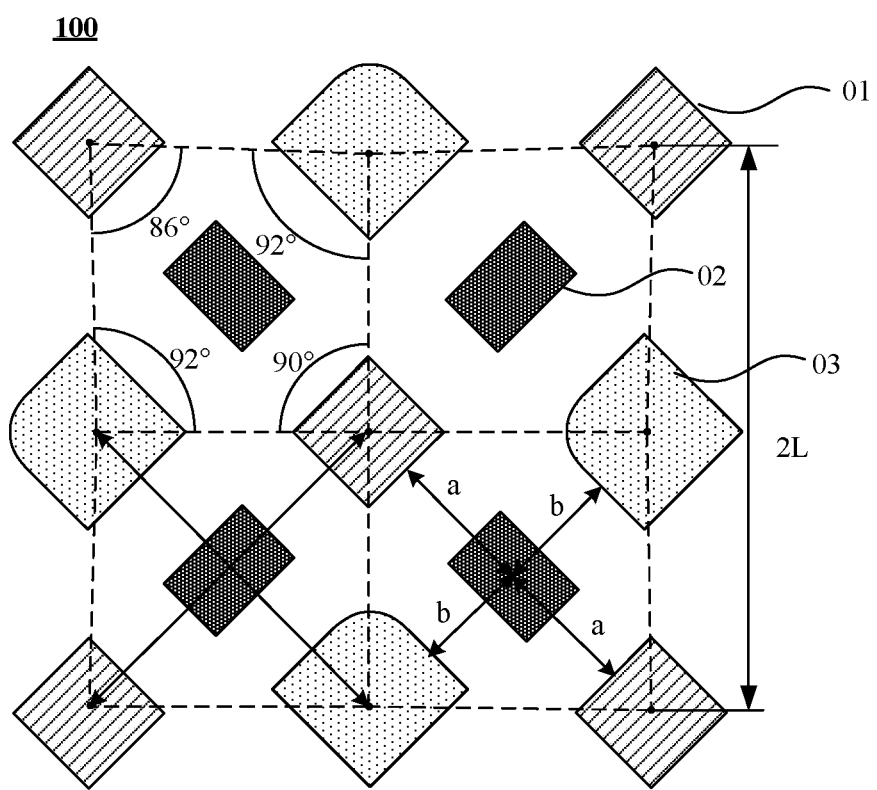
FIG. 12 is a schematic diagram showing the distribution of sub-pixels in a first one, which is at the top left corner of the pixel array shown in FIG. 11, of second virtual quadrilaterals of the pixel array.

FIG. 12 is a schematic diagram showing the distribution of sub-pixels in a first second virtual quadrilateral (i.e., a first one of second virtual quadrilaterals) that is at the top left corner of the pixel array shown in FIG. 11. As shown in FIG. 12, a first one, which is at the top left corner, of the first virtual quadrilaterals 10 of a second virtual quadrilateral 100 has a pair of equal angles (each of which is 92° as shown) and another angle of 90°, and each of the remaining first virtual quadrilaterals 10 has at least one angle of 90° whose vertex is located at the center of a red sub-pixel; and the blue sub-pixels 03 at two ends of a diagonal of a first virtual quadrilateral are disposed symmetrically with respect to a line connecting the centers of the two red sub-pixels 01 of the first virtual sub-quadrilateral to each other.

As shown in FIG. 12, if a line connecting the centers of a red sub-pixel 01 and a blue sub-pixel 03 adjacently disposed in a same column to each other has a length of L, a second virtual quadrilateral 100 is a square with a side of 2L and a center thereof is provided with a red sub-pixel 01, and the center of a green sub-pixel 02 in each first virtual quadrilateral 10 is located on a perpendicular bisector of a line connecting centers of a red sub-pixel 01 and a blue sub-pixel 03 adjacently disposed in the row direction or the column direction to each other. In addition, as shown in FIG. 12, vertical distances from the center of the green sub-pixel 02 to the boundaries of the light emitting areas of a red sub-pixel 01 and a blue sub-pixel 03 in each first virtual quadrilateral 10 are a and b, respectively, where a=b.

Figure 13:
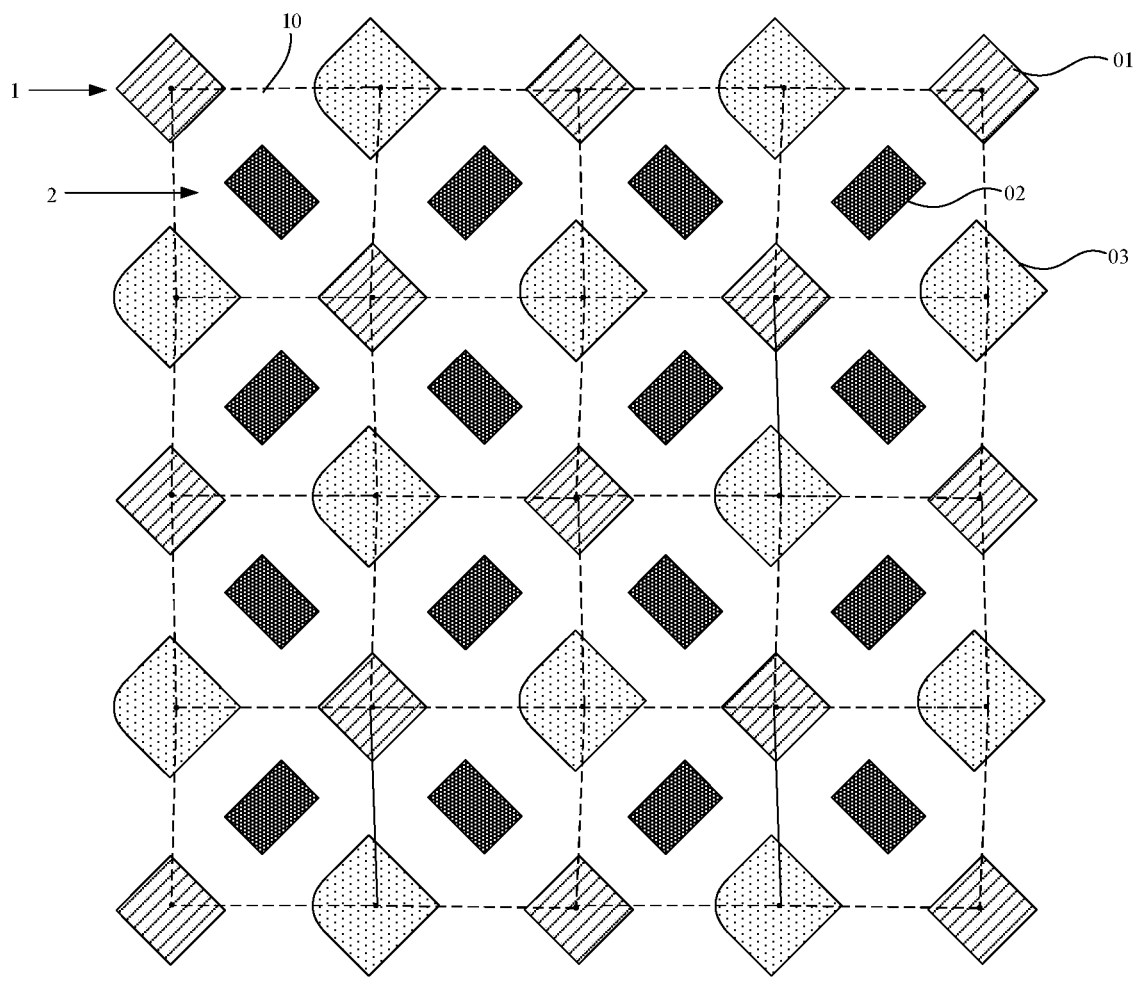
FIG. 13 is a schematic diagram showing a pixel array according to a third example of embodiments of the present disclosure.

In a third example, FIG. 13 is a schematic diagram showing a pixel array according to the third example of embodiments of the present disclosure. As shown in FIG. 13, positions and shapes of the sub-pixels in this pixel array are the same as the positions and shapes of the sub-pixels in the pixel array according to each of the foregoing two examples, except that the first corners of some of the blue sub-pixels 03 are oriented (or directed) differently. The first corners of all of the blue sub-pixels 03 in this pixel array are oriented in a same direction. For example, the first corners of all of the blue sub-pixels 03 in FIG. 13 are directed to the left.

Figure 14:
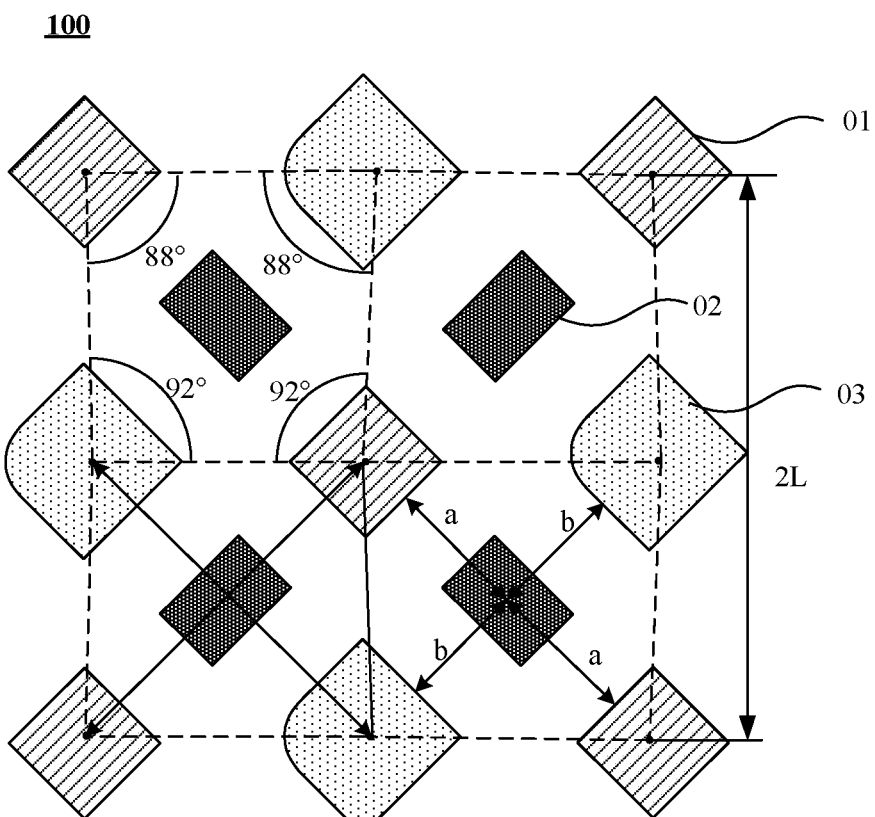
FIG. 14 is a schematic diagram showing the distribution of sub-pixels in a first one, which is at the top left corner of the pixel array shown in FIG. 13, of second virtual quadrilaterals of the pixel array.

FIG. 14 is a schematic diagram showing the distribution of sub-pixels in a first second virtual quadrilateral (i.e., a first one of second virtual quadrilaterals) that is at the top left corner of the pixel array shown in FIG. 13. As shown in FIG. 14, a first virtual quadrilateral 10, which is at the top left corner, of a second virtual quadrilateral 100 is an isosceles trapezoid, in which each of two angles is 92°, and each of the other two angles is 88°.

As shown in FIG. 14, if a line connecting centers of a red sub-pixel 01 and a blue sub-pixel 03 adjacently disposed in a same column to each other has a length of L, the second virtual quadrilateral 100 is a square with a side of 2L and a center thereof is provided with a red sub-pixel 01, and the center of a green sub-pixel 02 in each first virtual quadrilateral 10 is located on a perpendicular bisector of a line connecting centers of a red sub-pixel 01 and a blue sub-pixel 03 adjacently disposed in the row direction or the column direction to each other. In addition, as shown in FIG. 14, vertical distances from the center of the green sub-pixel 02 to the boundaries of the light emitting areas of a red sub-pixel 01 and a blue sub-pixel 03 in each first virtual quadrilateral 10 are a and b, respectively, where a=b.

Figure 15:
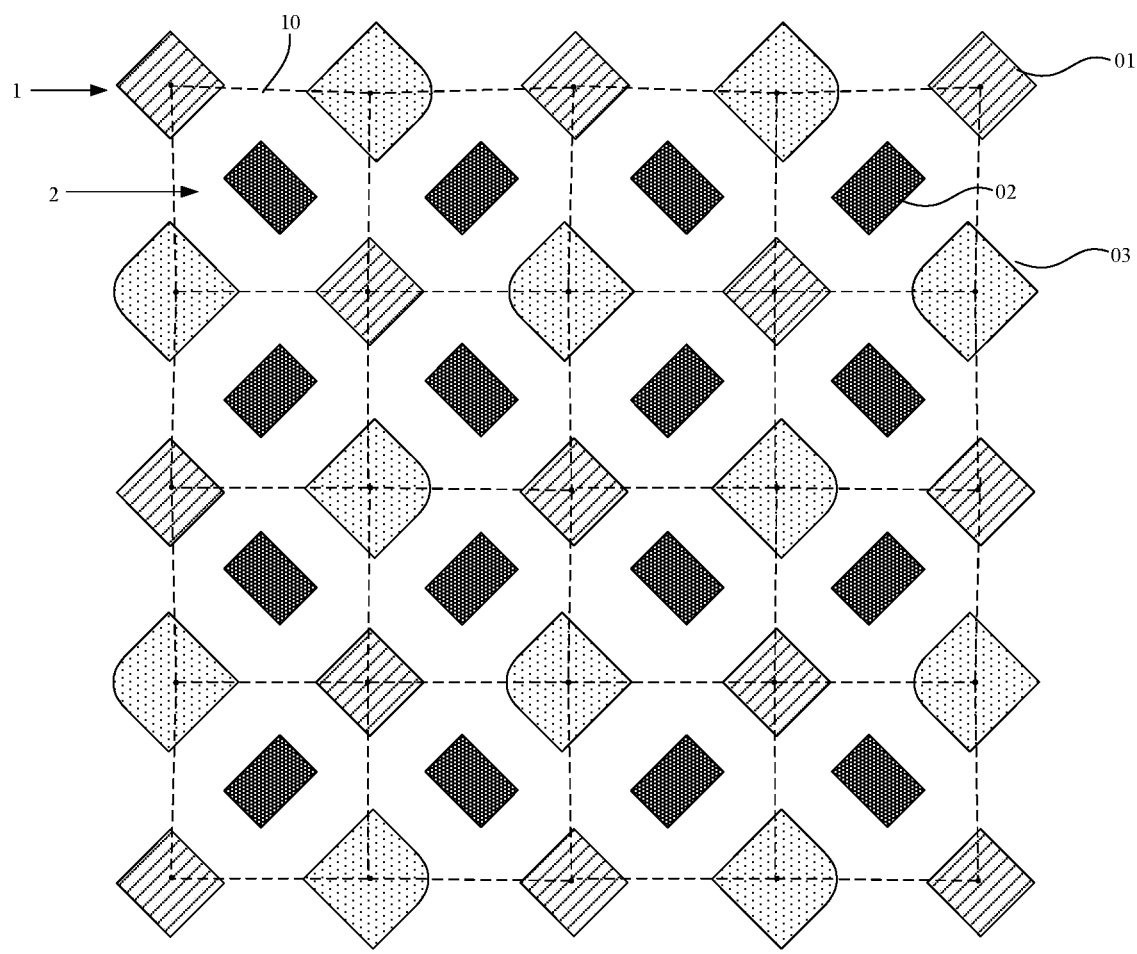
FIG. 15 is a schematic diagram showing a pixel array according to a fourth example of embodiments of the present disclosure.

In a fourth example, FIG. 15 is a schematic diagram showing a pixel array according to the fourth example of embodiments of the present disclosure. As shown in FIG. 15, positions and shapes of sub-pixels in this pixel array are the same as the positions and shapes of the sub-pixels in the pixel array according to each of the foregoing three examples, except that the first corners of some of the blue sub-pixels 03 are oriented (or directed) differently. In this pixel array, the first corners of the blue sub-pixels 03 positioned in a same row are oriented in a same direction, and the first corners of the blue sub-pixels 03 positioned in the first pixel rows 1 that are odd-numbered rows and the first corners of the blue sub-pixels 03 positioned in the first pixel rows 1 that are even-numbered rows are oriented in opposite directions, respectively. For example, the first corners of the blue sub-pixels 03 in the first one of the first pixel rows 1 are all directed to the right, while the first corners of the blue sub-pixels 03 in the second one of the first pixel rows 1 are all directed to the left.

Figure 16:
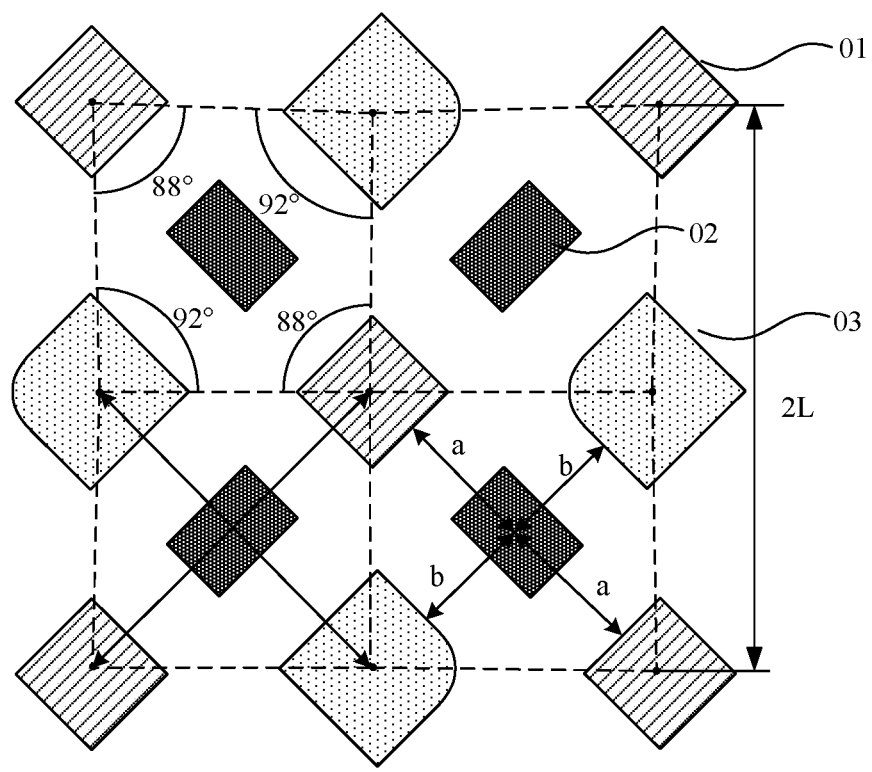
FIG. 16 is a schematic diagram showing the distribution of sub-pixels in a first one, which is at the top left corner of the pixel array shown in FIG. 15, of second virtual quadrilaterals of the pixel array.

FIG. 16 is a schematic diagram showing the distribution of sub-pixels in a first second virtual quadrilateral (i.e., a first one of second virtual quadrilaterals) that is at the top left corner of the pixel array shown in FIG. 15. As shown in FIG. 16, a first virtual quadrilateral 10, which is at the upper left corner, of a second virtual quadrilateral 100 has a pair of opposite obtuse angles each of which is 92° and another pair of opposite angles each of which is 88° formed therein.

As shown in FIG. 16, if a line connecting centers of a red sub-pixel 01 and a blue sub-pixel 03 adjacently disposed in a same column to each other has a length of L, each second virtual quadrilateral 100 is a square with a side of 2L and a center thereof is provided with a red sub-pixel 01, and a center of the green sub-pixel 02 in each first virtual quadrilateral 10 is located on a perpendicular bisector of a line connecting centers of a red sub-pixel 01 and a blue sub-pixel 03 adjacently disposed in the row direction or the column direction to each other. In addition, as shown in FIG. 16, vertical distances from the center of the green sub-pixel 02 to the boundaries of the light emitting areas of a red sub-pixel 01 and a blue sub-pixel 03 in each first virtual quadrilateral 10 are a and b, respectively, where a=b.

Figure 17:
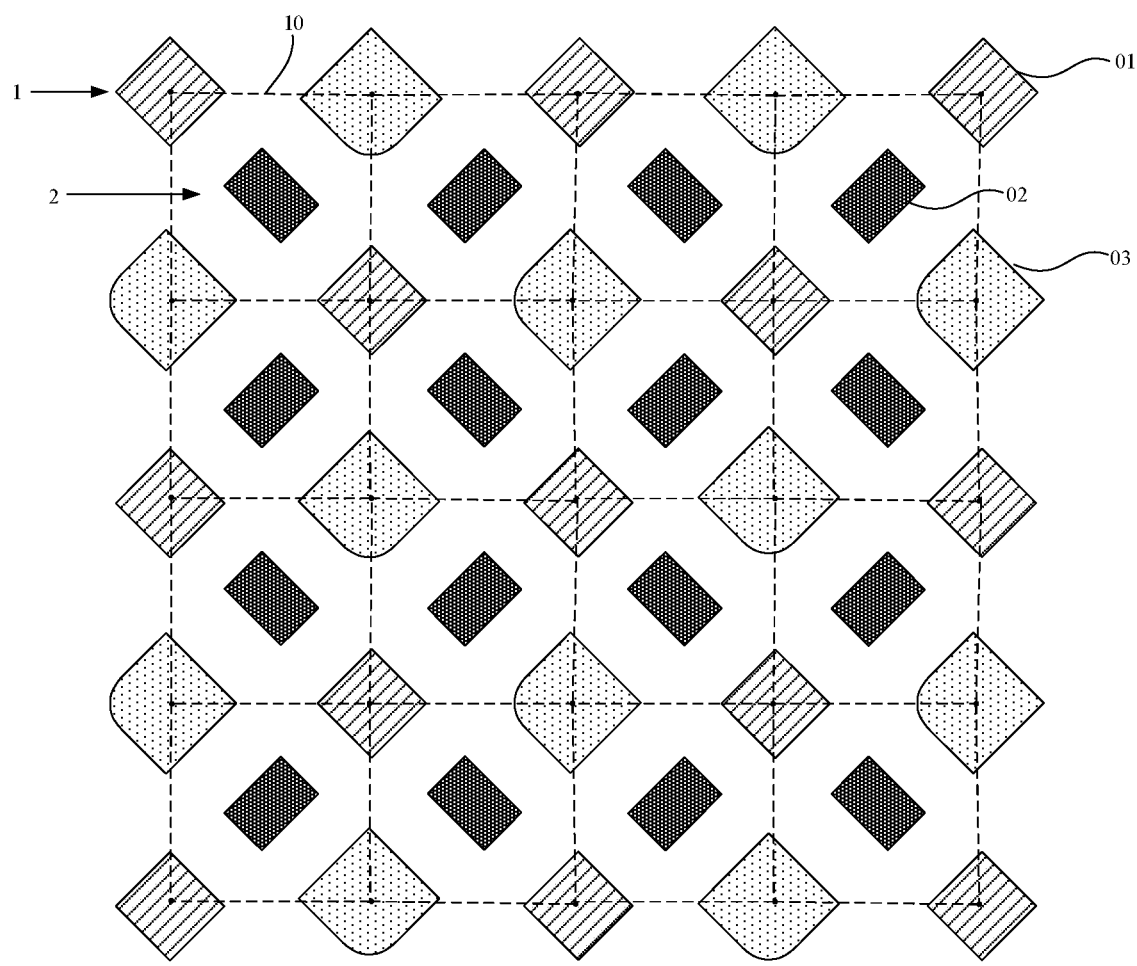
FIG. 17 is a schematic diagram showing a pixel array according to a fifth example of embodiments of the present disclosure.

In a fifth example, FIG. 17 is a schematic diagram showing a pixel array of the fifth example of embodiments of the present disclosure. As shown in FIG. 17, positions and shapes of sub-pixels in this pixel array are the same as the positions and shapes of the sub-pixels in the pixel array according to each of the foregoing four examples, except that the first corners of some of the blue sub-pixels 03 are oriented differently. In this pixel array, the first corners of the blue sub-pixels 03 located in a same row have a same orientation, and the first corners of the blue sub-pixels 03 located in a same column have a same orientation. For example, in FIG. 17, the first corners of the blue sub-pixels 03 in the first row is directed downward, and the first corners of the blue sub-pixels 03 in the first column faces to the left.

Figure 18:
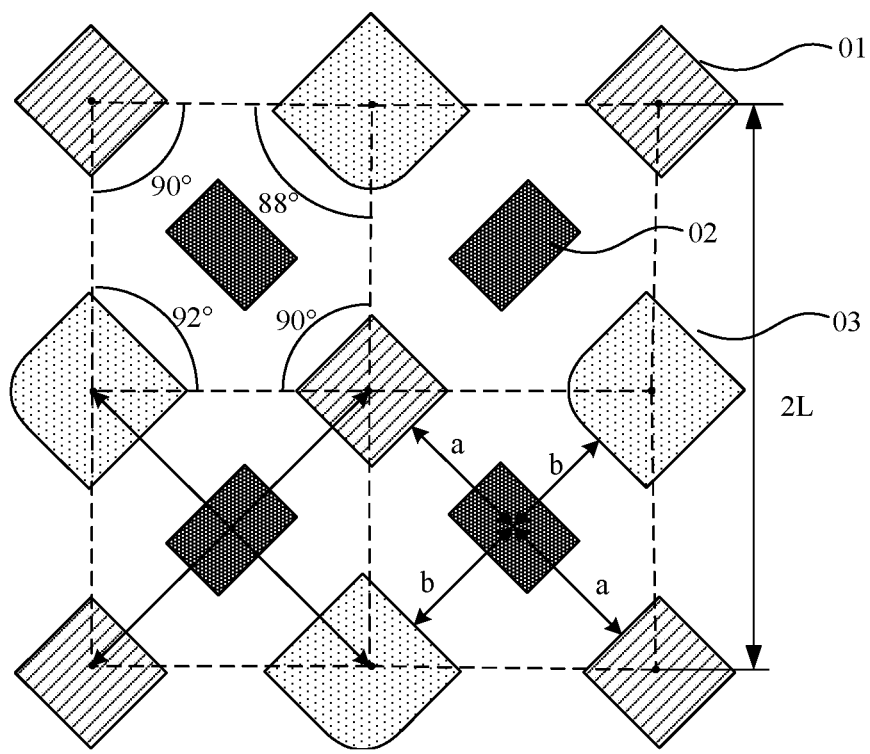
FIG. 18 is a schematic diagram showing the distribution of sub-pixels in a first one, which is at the top left corner of the pixel array shown in FIG. 17, of second virtual quadrilaterals of the pixel array.

FIG. 18 is a schematic diagram showing the distribution of sub-pixels in a first second virtual quadrilateral (i.e., a first one of second virtual quadrilaterals) that is at the top left corner of the pixel array shown in FIG. 17. As shown in FIG. 18, a first virtual quadrilateral 10, which is in the upper left corner, of a second virtual quadrilateral 100 has a pair of equal opposite angles each of which is 90° and another pair of opposite angles which are 92° and 88°, respectively.

As shown in FIG. 18, if a line connecting centers of a red sub-pixel 01 and a blue sub-pixel 03 adjacently disposed in a same column to each other has a length of L, the second virtual quadrilateral 100 is a square with a side of 2L and a center thereof is provided with a red sub-pixel 01, and a center of the green sub-pixel 02 in each first virtual quadrilateral 10 is located on a perpendicular bisector of a line connecting centers of a red sub-pixel 01 and a blue sub-pixel 03 adjacently disposed in the row direction or the column direction to each other. In addition, as shown in FIG. 18, vertical distances from the center of the green sub-pixel 02 to the boundaries of the light emitting areas of a red sub-pixel 01 and a blue sub-pixel 03 in each first virtual quadrilateral 10 are a and b, respectively, where a=b.

It should be noted that, the foregoing examples do not limit an arrangement of the blue sub-pixels 03 according to the embodiments of the present disclosure. For example, a pixel array resulted from rotating any one blue sub-pixel 03 around a midpoint of a line connecting the centers of two red sub-pixels 01 adjacent to the one blue sub-pixel 03 in the row direction by any angle, falls within the protection scope of an embodiment of the present disclosure.

In some embodiments, only the first corner of each blue sub-pixel 03 is circularly chamfered or rectilinearly chamfered, and is directed upward. In this case, a line connecting the vertexes of two opposite corners (the third corner and the fourth corner), which are in the row direction, of a red sub-pixel 01 and a blue sub-pixel 03 in a same row is approximately on a same straight line. A line connecting the vertexes of the first and second corners of a red sub-pixel 01 and the second corner of a blue sub-pixel 03 in a same column together is approximately on a same straight line.

Figure 19:
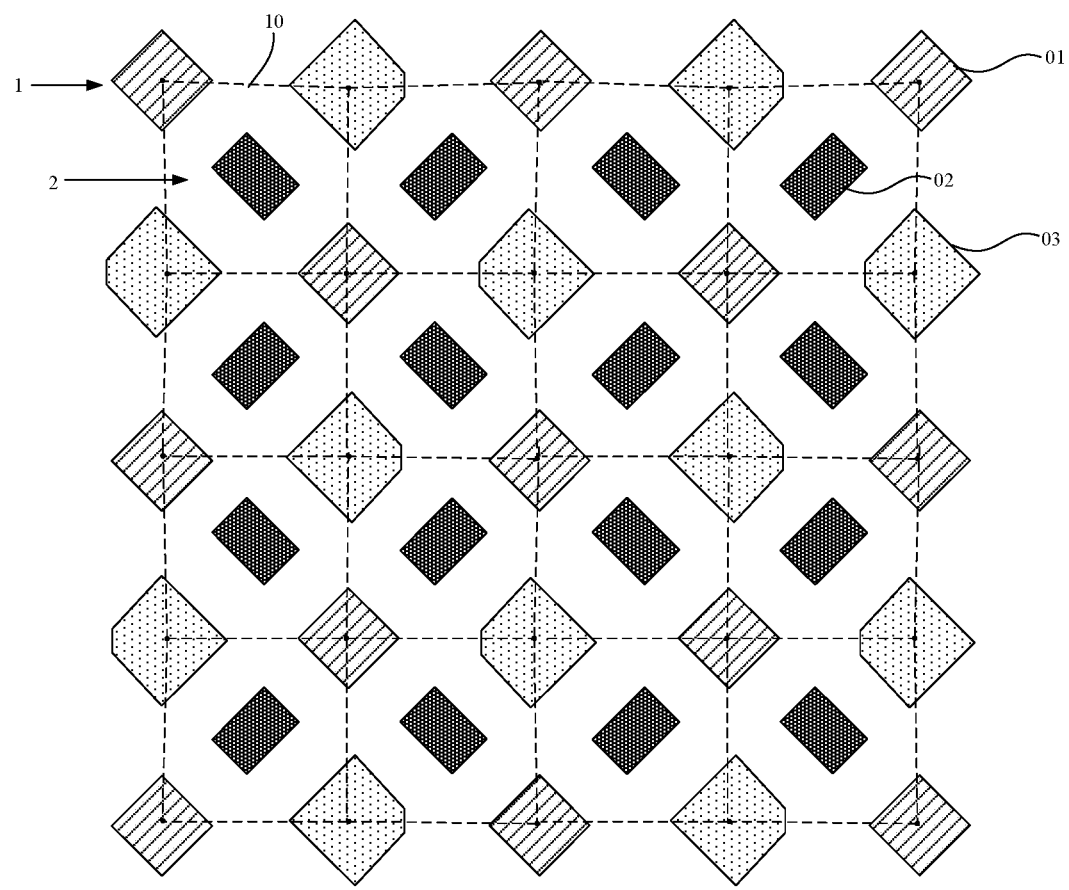
FIG. 19 is a schematic diagram showing a pixel array in which a first corner of each blue sub-pixel is rectilinearly (or flatly) chamfered, according to an embodiment of the present disclosure.

The foregoing first to fifth examples have been described by taking an example in which the first corner of each blue sub-pixel 03 is rounded (i.e., circularly chamfered). In some embodiments, FIG. 19 is a schematic diagram showing a pixel array in which the first corner of each blue sub-pixel is rectilinearly chamfered, according to an embodiment of the present disclosure. As shown in FIG. 19, positions, shapes and arrangement of sub-pixels in this pixel array are the same as the positions, shapes, and arrangements of the sub-pixels in the pixel array according to the fourth example. In this pixel array, the first corners of the blue sub-pixels 03 positioned in a same row are oriented in a same direction, and orientations of the first corners of the blue sub-pixels 03 positioned in the first pixel rows 1 that are odd-numbered rows are opposite to orientations of the first corners of the blue sub-pixels 03 positioned in the first pixel rows 1 that are even-numbered rows. For example, the first corners of the blue sub-pixels 03 in the first one of the first pixel rows 1 are all directed to the right, and the first corners of the blue sub-pixels 03 in the second one of the first pixel rows 1 are all directed to the left.

Figure 20:
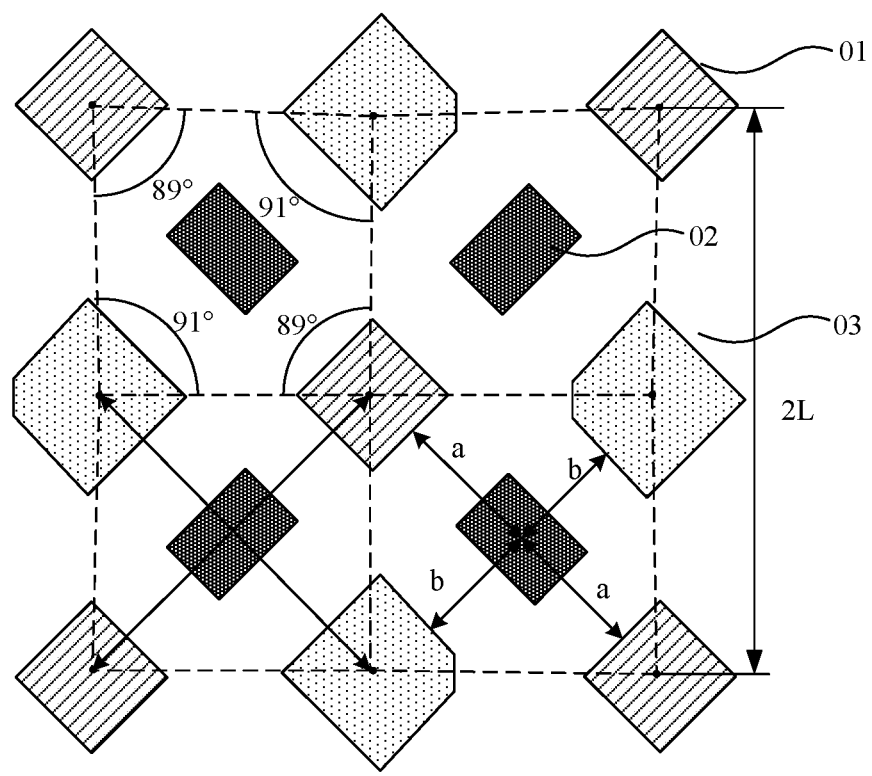
FIG. 20 is a schematic diagram showing the distribution of sub-pixels in a first one, which is at the top left corner of the pixel array shown in FIG. 19, of second virtual quadrilaterals of the pixel array.

FIG. 20 is a schematic diagram showing the distribution of sub-pixels in a first second virtual quadrilateral (i.e., a first one of second virtual quadrilaterals) that is at the top left corner of the pixel array shown in FIG. 19. As shown in FIG. 20, a first virtual quadrilateral 10, which is at the upper left corner, of a second virtual quadrilateral 100 has a pair of opposite obtuse angles each of which is 91° and another pair of opposite angles each of which is 89°.

As shown in FIG. 20, if a line connecting centers of a red sub-pixel 01 and a blue sub-pixel 03 adjacently disposed in a same column has a length of L, a second virtual quadrilateral 100 is a square with a side of 2L and a center thereof is provided with a red sub-pixel 01, and the center of the green sub-pixel 02 in each first virtual quadrilateral 10 is located on a perpendicular bisector of a line connecting centers of a red sub-pixel 01 and a blue sub-pixel 03 adjacently disposed in the row direction or the column direction. In addition, as shown in FIG. 20, vertical distances from the center of the green sub-pixel 02 to the boundaries of the light emitting areas of a red sub-pixel 01 and a blue sub-pixel 03 in each first virtual quadrilateral 10 are a and b, respectively, where a=b.

In addition, in the above examples, the first corner of a blue sub-pixel 03 is different from the other three corners of the blue sub-pixel 03, i.e., the distance from the vertex of the first corner of the blue sub-pixel 03 to the center of the blue sub-pixel is less than the distance from the vertex of each of the other three corners to the center of a respective blue sub-pixel. In some embodiments, a shape of the first corner of at least one of a red sub-pixel 01 and a green sub-pixel 02 may be designed to have the same shape as the shape of each blue sub-pixel 03. Description will be made below with reference to specific examples.

Figure 21:
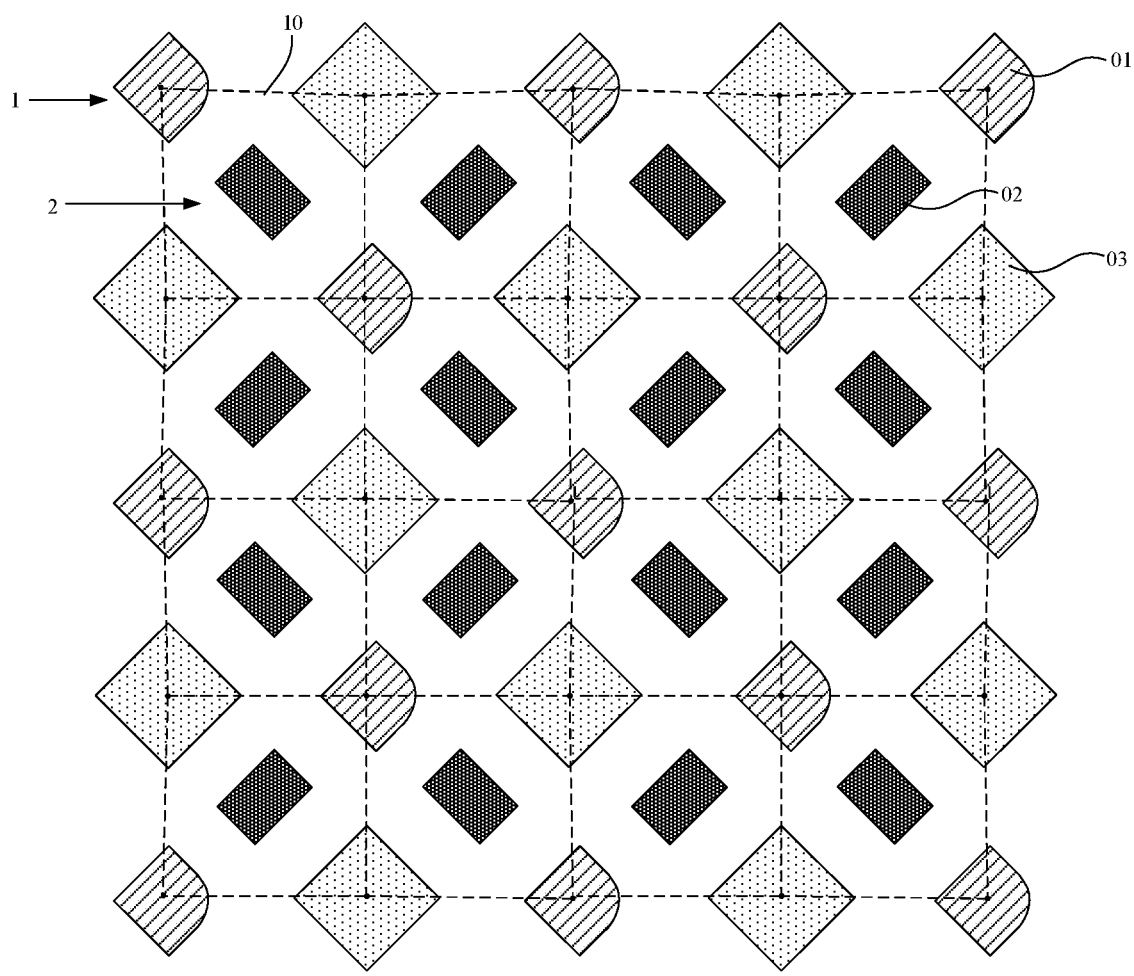
FIG. 21 is a schematic diagram showing a pixel array in which a first corner of each red sub-pixel is rectilinearly (or flatly) chamfered, according to an embodiment of the present disclosure.
Figure 22:
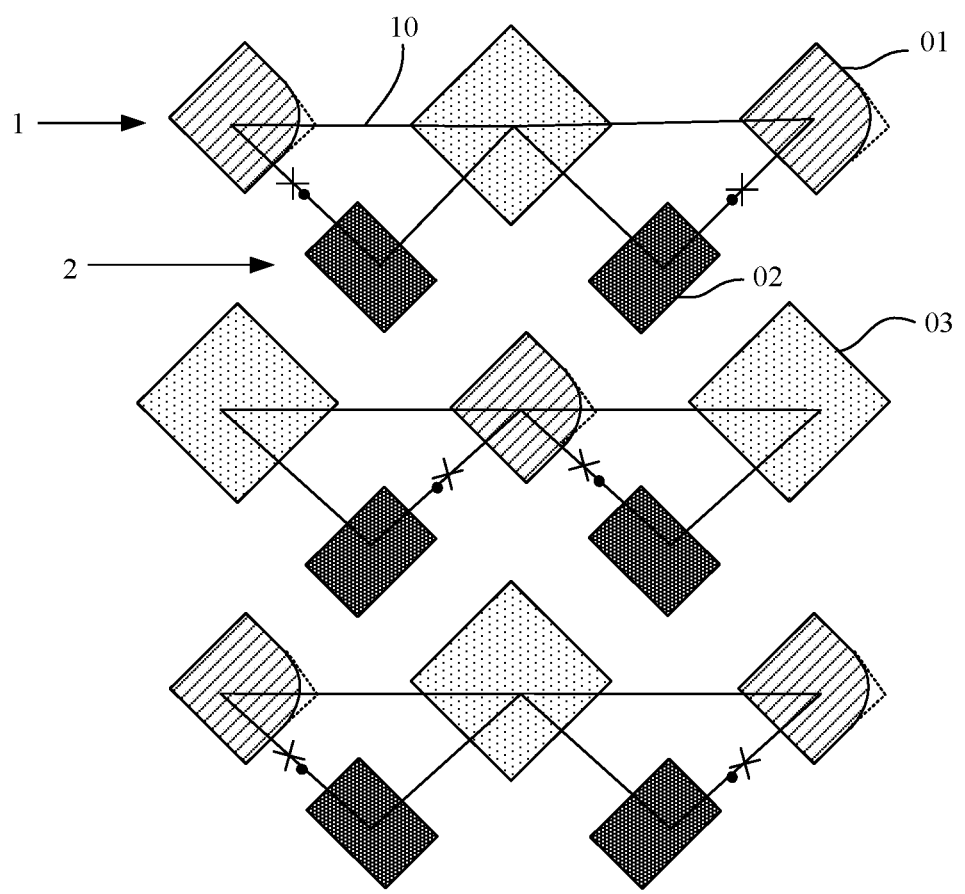
FIG. 22 is a schematic diagram showing the distribution of actual brightness centers of a pixel array, during displaying, with a first corner of each red sub-pixel being rounded (i.e., circularly chamfered) and being similar to a right angle, according to an embodiment of the present disclosure.

FIG. 21 is a schematic diagram showing a pixel array in which the first corner of each red sub-pixel is circularly chamfered, according to an embodiment of the present disclosure. As shown in FIG. 21, the first corner of each red sub-pixel 01 in the pixel array is directed to the right. Alternatively, the first corner of each red sub-pixel 01 may be orientated in an arbitrary direction by rotating the first corner of each red sub-pixel 01, so as to change the center of each red sub-pixel 01. The red sub-pixels 01, after the first corners thereof are rotated, may be arranged in the same way as the way in which the blue sub-pixels 03 are arranged as described above. FIG. 22 is a schematic diagram showing the distribution of actual brightness centers of a pixel array, during displaying, with the first corner of each red sub-pixel being rounded (i.e., circularly chamfered) and being similar to a right angle, according to an embodiment of the present disclosure. As shown in FIG. 22, as an example, the first corners of all of the red sub-pixels in the pixel array may be directed to the right. For example, the dotted corner at the first corner of each red sub-pixel 01 in FIG. 22 represents that the first corner of each red sub-pixel 01 is similar to a right angle in a pixel array in the related art, symbols "X" represent actual brightness centers when the pixel array in the related art displays, and symbols "•" represent actual brightness centers of the pixel array according to the present embodiment when displaying. As can be seen from FIG. 22, when the first corners of the red sub-pixels are rounded, the distribution of the actual brightness centers thereof is more uniform.

Figure 23:
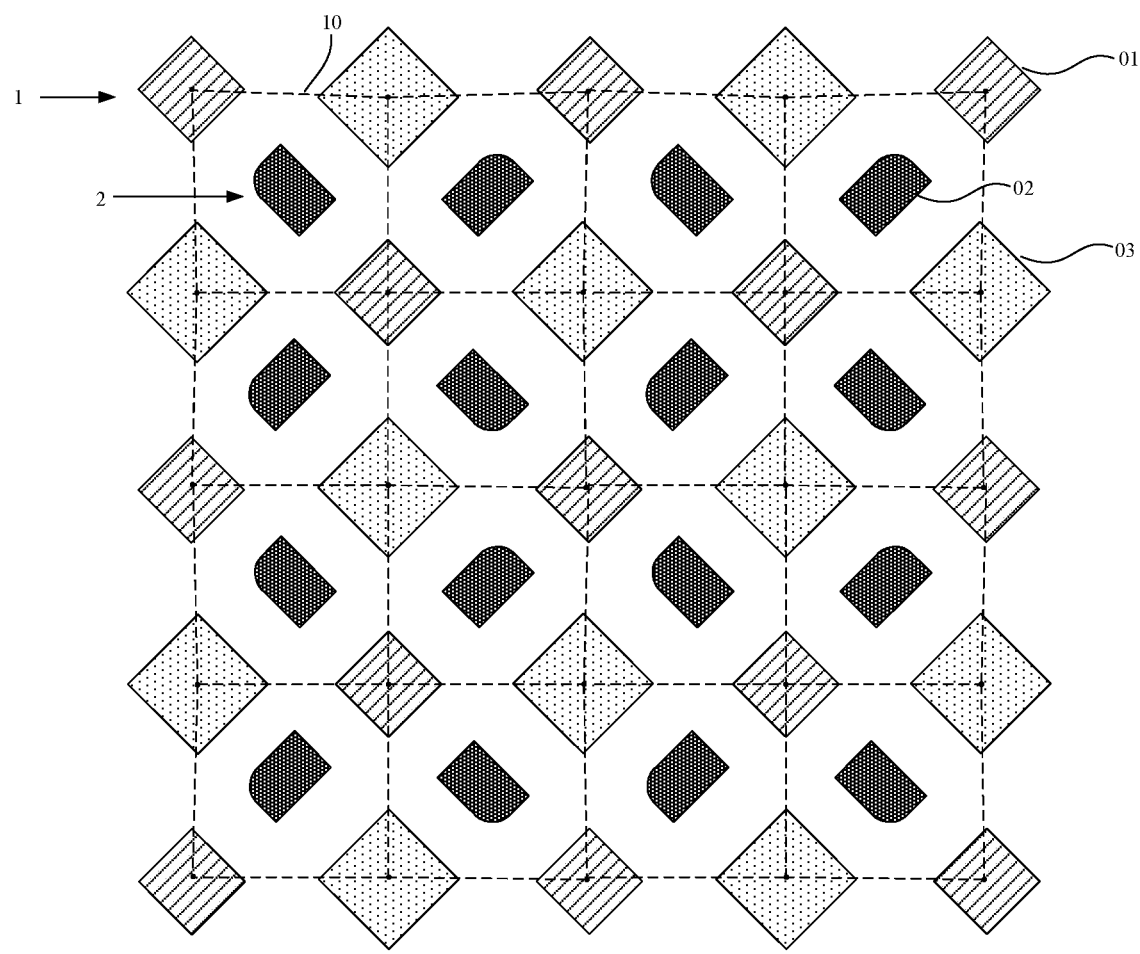
FIG. 23 is a schematic diagram showing a pixel array in which a first corner of each green sub-pixel is rectilinearly (or flatly) chamfered, according to an embodiment of the present disclosure.

FIG. 23 is a schematic diagram showing a pixel array in which the first corner of each green sub-pixel is rectilinearly chamfered according to an embodiment of the present disclosure. As shown in FIG. 23, the first corners of four green sub-pixels 02 in each second virtual quadrilateral 100 in the pixel array have orientations different from each other, and two green sub-pixels 02, which are in a same column, of the four green sub-pixels 02 are symmetric with respect to the row direction. Alternatively, the first corners of the green sub-pixels 02 may be oriented in an arbitrary direction by rotating the first corners of the green sub-pixels 02, so as to change the centers of the green sub-pixels 02. The green sub-pixels 02, after the first corners thereof are rotated, may be arranged in the same way as the way in which the blue sub-pixels 03 are arranged as described above.

Figure 24:
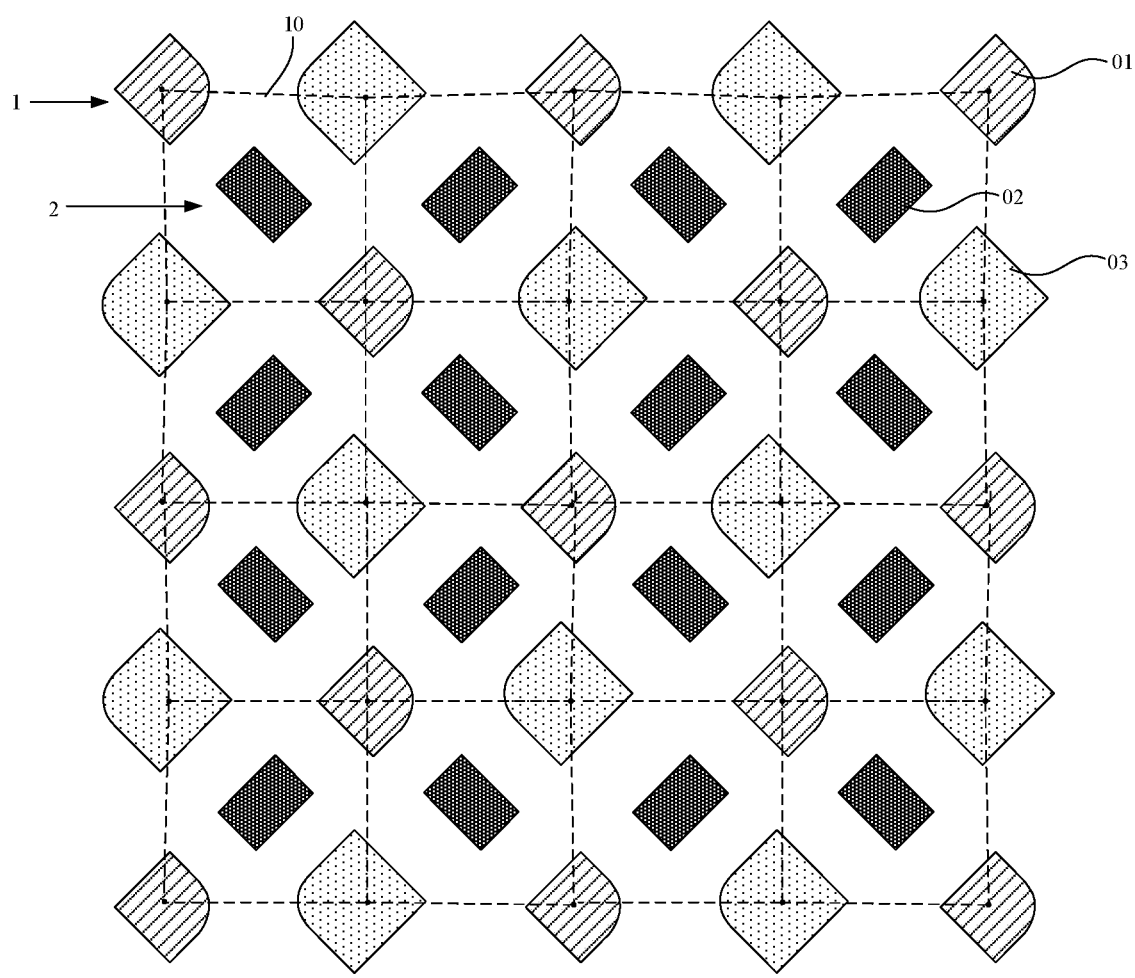
FIG. 24 is a schematic diagram showing a pixel array in which a first corner of each of red sub-pixels and blue sub-pixels is rectilinearly (or flatly) chamfered, according to an embodiment of the present disclosure.

FIG. 24 is a schematic diagram showing a pixel array in which the first corner of each of red sub-pixels and blue sub-pixels is rectilinearly (or flatly) chamfered, according to an embodiment of the present disclosure. As shown in FIG. 24, the first corners of the red sub-pixels 01 in a same row are oriented in a same direction, and the first corners of the blue sub-pixels 03 in a same row are oriented in a same direction. In a same row, the orientation of the first corners of the red sub-pixels 01 is opposite to the orientation of first corners of the blue sub-pixels. Alternatively, the first corner of each of a red sub-pixel 01 and a blue sub-pixel 03 may be oriented in any direction by rotating the first corner of each of the red sub-pixel 01 and the blue sub-pixel 03, so as to change the center of each of the red sub-pixel 01 and the blue sub-pixel 03. The red sub-pixels 01 and the blue sub-pixels 03, after the first corners thereof are rotated, may be arranged in the same way as the way in which the blue sub-pixels 03 are arranged as described above.

In a second aspect, an embodiment of the present disclosure provides a display device, which includes the pixel array according to any one of the foregoing embodiments of the present disclosure. The display device may be any product or component with a display function, such as a mobile phone, a tablet computer, a television, a display, a notebook computer, a digital photo frame, a navigator, or the like.

It should be understood that the above embodiments are merely exemplary embodiments adopted to explain the principles of the present disclosure, and the present disclosure is not limited thereto. It will be apparent to one of ordinary skill in the art that various modifications and improvements may be made therein without departing from the spirit and scope of the present disclosure, and such modifications and improvements also fall within the scope of the present disclosure.

What is claimed is:

1. A pixel array, comprising a plurality of sub-pixels, which comprise first sub-pixels, second sub-pixels, and third sub-pixels; the first sub-pixels and the third sub-pixels are alternately arranged along a row direction and form a plurality of first pixel rows, the first sub-pixels and the third sub-pixels, which are in a same column, in the plurality of first pixel rows are alternately arranged, and the second sub-pixels are arranged side by side along the row direction and form a plurality of second pixel rows; lines sequentially connecting centers of two of the first sub-pixels and two of the third sub-pixels, which are arranged in an array, together form a first virtual quadrilateral, and one of the second sub-pixels is in each first virtual quadrilateral; wherein
at least a portion of interior angles of the first virtual quadrilateral is not equal to 90°;
one of a first straight line and a second straight line, which are in the row direction and a column direction respectively and pass through a center of each sub-pixel of at least one sub-pixel of the plurality of sub-pixels, divides the sub-pixel into two parts having areas different from each other, and the other of the first straight line and the second straight line divides the sub-pixel into two parts having areas equal to each other; and
a contour of a shape of each sub-pixel of the at least one sub-pixel comprises an arc line portion, and the arc line portion has a length less than a length of each of remaining portions of the contour of the shape of the sub-pixel comprising the arc line portion.

2. The pixel array according to claim 1, wherein a ratio of the areas of the two parts having areas different from each other ranges from 2:8 to 8:2 and is not equal to 1:1.

3. The pixel array according to claim 1, wherein the two parts having areas different from each other comprise a first corner and a second corner opposite to each other, and a distance from a vertex of the first corner to a center of the sub-pixel comprising the two parts having areas different from each other is different from a distance from a vertex of the second corner to the center of the sub-pixel comprising the two parts having areas different from each other.

4. The pixel array according to claim 3, wherein the distance from the vertex of the first corner to the center of the sub-pixel comprising the two parts having areas different from each other is less than the distance from the vertex of the second corner to the center of the sub-pixel comprising the two parts having areas different from each other.

5. The pixel array according to claim 1, wherein the length of the arc line portion is less than a size of the sub-pixel comprising the arc line portion in the row direction or a column direction.

6. The pixel array according to claim 1, wherein for each first virtual quadrilateral, distances from a center of the second sub-pixel within the first virtual quadrilateral to the centers of the two first sub-pixels on vertexes of the first virtual quadrilateral are not equal to each other, and a ratio of minimum distances between the second sub-pixel within the first virtual quadrilateral and the two first sub-pixels on the vertexes of the first virtual quadrilateral ranges from 0.8 to 1.2; and/or
for each first virtual quadrilateral, distances from a center of the second sub-pixel within the first virtual quadrilateral to the centers of the two third sub-pixels on vertexes of the first virtual quadrilateral are not equal to each other, and a ratio of minimum distances between the second sub-pixel within the first virtual quadrilateral and the two third sub-pixels on the vertexes of the first virtual quadrilateral ranges from 0.8 to 1.2.

7. The pixel array according to claim 1, wherein for each first virtual quadrilateral, connecting lines between a center of the second sub-pixel within the first virtual quadrilateral to the centers of the two first sub-pixels on vertexes of the first virtual quadrilateral are not parallel to each other or not on a same straight line, and extension lines of minimum paths between the second sub-pixel within the first virtual quadrilateral and the two first sub-pixels on the vertexes of the first virtual quadrilateral are parallel to each other or on a same straight line; and/or
for each first virtual quadrilateral, connecting lines between a center of the second sub-pixel within the first virtual quadrilateral to the centers of the two third sub-pixels on vertexes of the first virtual quadrilateral are not parallel to each other or not on a same straight line, and extension lines of minimum paths between the second sub-pixel within the first virtual quadrilateral and the two third sub-pixels on the vertexes of the first virtual quadrilateral are parallel to each other or on a same straight line.

8. The pixel array according to claim 1, wherein a shape of each of the first sub-pixels, the second sub-pixels and the third sub-pixels comprises a polygon, the third sub-pixels comprise the at least one sub-pixel, and a shape of each of the third sub-pixels is different from a shape of each of the first sub-pixels or a shape of each of the second sub-pixels.

9. The pixel array according to claim 1, wherein an intersection point of extension lines of both sides of at least one vertex angle of the first sub-pixels, the second sub-pixels and the third sub-pixels does not coincide with a vertex of the at least one vertex angle, and a distance from the intersection point of extension lines of both sides of at least one vertex angle to a center of the sub-pixel comprising the at least one vertex angle is not equal to a distance from an intersection point of extension lines of both sides of another vertex angle of the sub-pixel comprising the at least one vertex angle to the center of the sub-pixel comprising the at least one vertex angle.

10. The pixel array according to claim 1, wherein the shape of each of the first sub-pixels, the second sub-pixels and the third sub-pixels comprises a polygon, and each of the first sub-pixels, the second sub-pixels and the third sub-pixels comprises a pair of vertex angles opposite to each other in the row direction and a pair of vertex angles opposite to each other in a column direction; and in each first pixel row, vertexes of the vertex angles of the first sub-pixels and the third sub-pixels in the row direction are on a same straight line, and/or the sub-pixels, which are located on a same straight line along the column direction, among the plurality of the sub-pixels form a pixel column, in each pixel column where the first sub-pixels and the third sub-pixels are located, vertexes of the vertex angles of the first sub-pixels and the third sub-pixels in a column direction are on a same straight line.

11. The pixel array according to claim 1, wherein the first sub-pixels comprise red sub-pixels, the second sub-pixels comprise green sub-pixels, the third sub-pixels comprise blue sub-pixels, and each of the third sub-pixels has an area which is larger than that of each of the first sub-pixels and larger than that of each of the second sub-pixels.

12. The pixel array according to claim 1, wherein a connecting line between an intersection point of extension lines of both sides of a first corner of each sub-pixel of the at least one sub-pixel and a center of the sub-pixel is a first line segment, and a straight line perpendicular to the first line segment and passing through a center of each sub-pixel of the at least one sub-pixel divides the sub-pixel into the two parts having areas different from each other.

13. The pixel array according to claim 1, wherein a connecting line between an intersection point of extension lines of both sides of a vertex angle of each sub-pixel of the at least one sub-pixel and a center of the sub-pixel is a symmetry axis of the sub-pixel.

14. A pixel array, comprising a plurality of sub-pixels, which comprise first sub-pixels, second sub-pixels, and third sub-pixels; the first sub-pixels and the third sub-pixels are alternately arranged along a row direction and form a plurality of first pixel rows, the first sub-pixels and the third sub-pixels, which are in a same column, in the plurality of first pixel rows are alternately arranged, and the second sub-pixels are arranged side by side along the row direction and form a plurality of second pixel rows; lines sequentially connecting centers of two of the first sub-pixels and two of the third sub-pixels, which are arranged in an array, together form a first virtual quadrilateral, and one of the second sub-pixels is in each first virtual quadrilateral; wherein at least a portion of interior angles of the first virtual quadrilateral is not equal to 90°;

one of a first straight line and a second straight line, which are in the row direction and a column direction respectively and pass through a center of each sub-pixel of at least one sub-pixel of the plurality of sub-pixels, divides the sub-pixel into two parts having areas different from each other, and the other of the first straight line and the second straight line divides the sub-pixel into two parts having areas equal to each other; and a contour of a shape of each sub-pixel of the at least one sub-pixels comprises an arc line portion, and for the sub-pixel having the arc line portion, a connecting line between a midpoint of the arc line portion and a vertex of a vertex angle opposite to the arc line portion passes through a center of the sub-pixel.

15. A pixel array, comprising a plurality of sub-pixels, which comprise first sub-pixels, second sub-pixels, and third sub-pixels; the first sub-pixels and the third sub-pixels are alternately arranged along a row direction and form a plurality of first pixel rows, the first sub-pixels and the third sub-pixels, which are in a same column, in the plurality of first pixel rows are alternately arranged, and the second sub-pixels are arranged side by side along the row direction and form a plurality of second pixel rows; lines sequentially connecting centers of two of the first sub-pixels and two of the third sub-pixels, which are arranged in an array, together form a first virtual quadrilateral, and one of the second sub-pixels is in each first virtual quadrilateral; wherein at least a portion of interior angles of the first virtual quadrilateral is not equal to 90°;

one of a first straight line and a second straight line, which are in the row direction and a column direction respectively and pass through a center of each sub-pixel of at least one sub-pixel of the plurality of sub-pixels, divides the sub-pixel into two parts having areas different from each other, and the other of the first straight line and the second straight line divides the sub-pixel into two parts having areas equal to each other; and a contour of a shape of each of the at least one sub-pixel comprises an arc line and two straight line segments each directly connecting to the arc line.

16. The pixel array according to claim 15, wherein the two straight line segments directly connecting to the arc line have a same length.

* * * * *